United States Patent
Cheon et al.

(10) Patent No.: US 11,092,639 B2
(45) Date of Patent: Aug. 17, 2021

(54) DISPLAY DEVICE AND INSPECTION METHOD OF DISPLAY DEVICE

(71) Applicant: Samsung Display Co., Ltd., Yongin-Si (KR)

(72) Inventors: Soo Hong Cheon, Seoul (KR); Dong Hee Shin, Asan-si (KR)

(73) Assignee: Samsung Display Co., Ltd.

( * ) Notice: Subject to any disclaimer, the term of this patent is extended or adjusted under 35 U.S.C. 154(b) by 35 days.

(21) Appl. No.: 16/711,320

(22) Filed: Dec. 11, 2019

(65) Prior Publication Data
US 2020/0363466 A1 Nov. 19, 2020

(30) Foreign Application Priority Data

May 16, 2019 (KR) .................. 10-2019-0057354

(51) Int. Cl.
*G01R 31/28* (2006.01)
*G09G 3/00* (2006.01)

(52) U.S. Cl.
CPC ......... *G01R 31/2825* (2013.01); *G09G 3/006* (2013.01)

(58) Field of Classification Search
CPC ............... G01R 31/2825; G09G 3/006; G09G 2300/0426; G02F 1/136254; G02F 1/1309; G02F 1/13458; G02F 1/136286; H01L 27/3276
USPC .......................................... 324/511, 510, 500
See application file for complete search history.

(56) References Cited

U.S. PATENT DOCUMENTS

| | | | |
|---|---|---|---|
| 2015/0286084 A1 | 10/2015 | Yoshida et al. | |
| 2016/0042677 A1 | 2/2016 | Lee | |
| 2017/0221399 A1* | 8/2017 | Yan | G09G 3/2003 |
| 2019/0147780 A1* | 5/2019 | Sunohara | G01R 31/2601 324/762.01 |
| 2019/0302558 A1* | 10/2019 | Hirata | G02F 1/136286 |
| 2020/0402432 A1* | 12/2020 | Yang | G09G 3/3266 |
| 2021/0072608 A1* | 3/2021 | Iwasa | G02F 1/1368 |

FOREIGN PATENT DOCUMENTS

| | | |
|---|---|---|
| KR | 10-0783706 B1 | 12/2007 |
| KR | 10-0973803 B1 | 8/2010 |
| KR | 10-1140575 B1 | 5/2012 |
| KR | 10-2016-0124981 A | 10/2016 |
| KR | 10-2017-0081057 A | 7/2017 |

* cited by examiner

*Primary Examiner* — Giovanni Astacio-Oquendo
(74) *Attorney, Agent, or Firm* — Innovation Counsel LLP

(57) ABSTRACT

A display device and an inspection method of the display device includes: a display area including pixels and data lines; and a non-display area located around the display area and including an inspection unit, in which a first data line includes a first inspection line located in the inspection unit, a second data line adjacent to the first data line includes a second inspection line located in the inspection unit, the first inspection line extends in a second direction different from the first direction, the second inspection line includes a first portion extending in the second direction, a second portion bent toward the first inspection line from the first portion and then extending toward the first inspection line, and a third portion bent from the second portion and extending in parallel with the first inspection line, and end portions of the first and second inspection lines are spaced apart.

20 Claims, 19 Drawing Sheets

DISPLAY DEVICE AND INSPECTION METHOD OF DISPLAY DEVICE

CROSS-REFERENCE TO RELATED APPLICATION

This application claims priority to and the benefit of Korean Patent Application No. 10-2019-0057354 filed in the Korean Intellectual Property Office on May 16, 2019, the entire contents of which are incorporated herein by reference.

BACKGROUND

(a) Technical Field

The present disclosure relates to a display device and an inspection method of the display device.

(b) Description of the Related Art

Display devices such as liquid crystal displays (LCD) and organic light emitting diode displays (OLED display) include a display panel with a display area capable of displaying an image and a non-display area that does not display an image. In the display area, a plurality of pixels and a plurality of signal lines are positioned. One pixel may include a pixel circuit including a thin film transistor connected to a signal line, and a display unit connected to the pixel circuit. The plurality of signal lines includes a plurality of data lines for transmitting a data signal and a plurality of gate lines for transmitting a gate signal. The plurality of signal lines may extend to the non-display area to receive a signal.

A manufacturing method of such a display device includes a data line inspection step of inspecting whether the data line is electrically open or short after forming the data line on the substrate.

The above information disclosed in this Background section is only for enhancement of understanding of the background of the invention and therefore it may contain information that does not form the prior art that is already known in this country to a person of ordinary skill in the art.

SUMMARY

The present inventive concept has been made in an effort to provide a display device and an inspection method of the display device having advantages of being capable of performing fast and accurate inspection of data lines in a high-resolution display device.

An embodiment of the present inventive concept provides a display device including: a display area including a plurality of pixels and a plurality of data lines; and a non-display area located around the display area and including an inspection unit, in which a first data line among the plurality of data lines includes a first inspection line located in the inspection unit, a second data line adjacent to the first data line in a first direction among the plurality of data lines includes a second inspection line located in the inspection unit, the first inspection line extends in a second direction different from the first direction, the second inspection line includes a first portion extending in the second direction, a second portion bent toward the first inspection line from the first portion and extending toward the first inspection line, and a third portion bent from the second portion and extending in parallel with the first inspection line, and an end portion of the first inspection line and an end portion of the second inspection line are spaced apart from each other in the second direction.

The device may further have: the inspection unit includes a first inspection area and a second inspection area adjacent to each other in the second direction, both the first inspection line and the second inspection line located in the first inspection area, and the first inspection line located in and the second inspection line not located in the second inspection area.

The device may further have: the first data line includes a first expansion located between the first inspection area and the display area and connected to the first inspection line, and the second data line includes a second expansion located between the first inspection area and the display area and connected to the second inspection line.

The device may further have: the first expansion and the second expansion are misaligned in the first direction.

The device may further have: a distance between two outer edges of the first and second inspection lines is smaller than a distance between two adjacent data lines in the display area among the plurality of data lines.

Another embodiment of the present inventive concept provides a display device including: a display area including a plurality of pixels and a plurality of data lines; and a non-display area located around the display area and including an inspection unit, in which the plurality of data lines is divided into a plurality of groups which is repeatedly disposed in a first direction, each of the plurality of groups includes a first data line and a second data line, the first data line includes a first inspection line located in the inspection unit, the second data line includes a second inspection line located in the inspection unit, the first inspection line extends in a second direction different from the first direction, the second inspection line includes a portion bent toward the first inspection line, and an end portion of the first inspection line and an end portion of the second inspection line are spaced apart from each other in the second direction.

The device may further have: the inspection unit includes a first inspection area and a second inspection area adjacent to each other in the second direction, both the first inspection line and the second inspection line are located in the first inspection area, and the first inspection line is located in and the second inspection line is not located in the second inspection area.

The device may further have: the first data line includes a first expansion located between the first inspection area and the display area and connected to the first inspection line, and the second data line includes a second expansion located between the first inspection area and the display area and connected to the second inspection line.

The device may further have: the first expansion and the second expansion are misaligned in the first direction.

The device may further have: a distance between two outer edges of the first and second inspection lines included in one group among the plurality of groups is smaller than a distance between two adjacent data lines in the display area among the plurality of data lines.

The device may further have: the plurality of groups includes a first group and a second group adjacent to each other, and a distance between the second inspection line included in the first group and the first inspection line included in the second group is greater than a distance between two adjacent data lines in the display area among the plurality of data lines.

The device may further have: a distance between the second inspection line included in the first group and the first inspection line included in the second group is greater than 50 micrometers.

The device may further have: the second inspection line includes a first portion extending in the second direction, a second portion bent toward the first inspection line from the first portion and extending toward the first inspection line, and a third portion bent from the second portion and extending in parallel with the first inspection line.

The device may further have: each of the plurality of groups further includes a third data line adjacent to the second data line, the third data line includes a third inspection line located in the inspection unit, the third inspection line includes a portion bent toward the second inspection line, and an end portion of the third inspection line and an end portion of the second inspection line are spaced apart from each other in the second direction.

The device may further have: the inspection unit includes a first inspection area, a second inspection area, and a third inspection area adjacent to each other in the second direction, the first inspection line, the second inspection line, and the third inspection line are all located in the first inspection area, the first inspection line and the second inspection line are located in and the third inspection line is not located in the second inspection area, and the first inspection line is located in and the second inspection line and the third inspection line are not located in the third inspection area.

Yet another embodiment of the present inventive concept provides an inspection method of a display device including a display area including a plurality of pixels and a plurality of data lines, and a non-display area located around the display area and including an inspection unit, in which the inspection unit includes a first inspection area and a second inspection area adjacent to each other, the plurality of data lines is divided into a plurality of groups which is repeatedly disposed in a first direction, each of the plurality of groups includes a first data line and a second data line, the first data line includes a first inspection line located in the first and second inspection areas, and the second data line includes a second inspection line located in the first inspection area and not located in the second inspection area, including: applying a first input signal to the first inspection line and the second inspection line by scanning in the first direction in the first inspection area; applying a second input signal to the first inspection line by scanning in the first direction in the second inspection area; and detecting a data line which is defective through an output signal obtained by measuring potentials of the plurality of data lines.

The device may further have: a distance between two outer edges of the first inspection line and the second inspection line included in one group among the plurality of groups is smaller than a width in the first direction of an inspection pin of an inspection device, the inspection device being used in the applying of the first input signal and the applying of the second input signal.

The device may further have: the plurality of groups includes a first group and a second group adjacent to each other, and a distance between the second inspection line included in the first group and the first inspection line included in the second group is greater than a width of the inspection pin in the first direction.

The device may further have: the output signal includes, a first output signal detected in response to applying the first input signal to the first inspection area, and a second output signal detected in response to applying the second input signal to the second inspection area.

The device may further have: waveforms of the first and second output signals detected when the first data line is defective are different from waveforms of the first and second output signals detected when the second data line is defective.

According to an embodiment of the present inventive concept, it is possible to perform a fast and accurate inspection of data lines of a high resolution display device.

Figure 11:
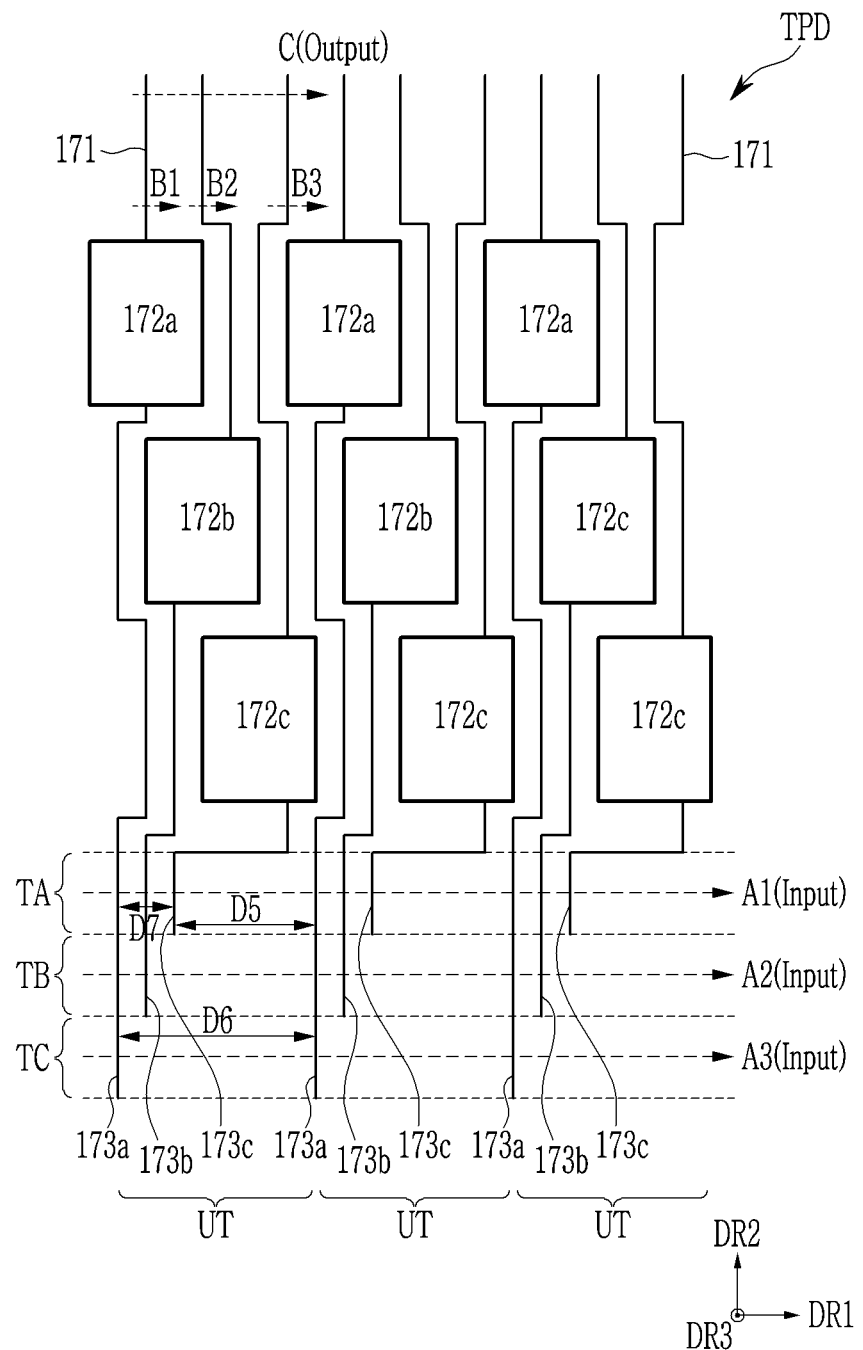
FIG. 11 illustrates a portion of an inspection unit in the display device according to an embodiment of the present inventive concept.
Figure 15:
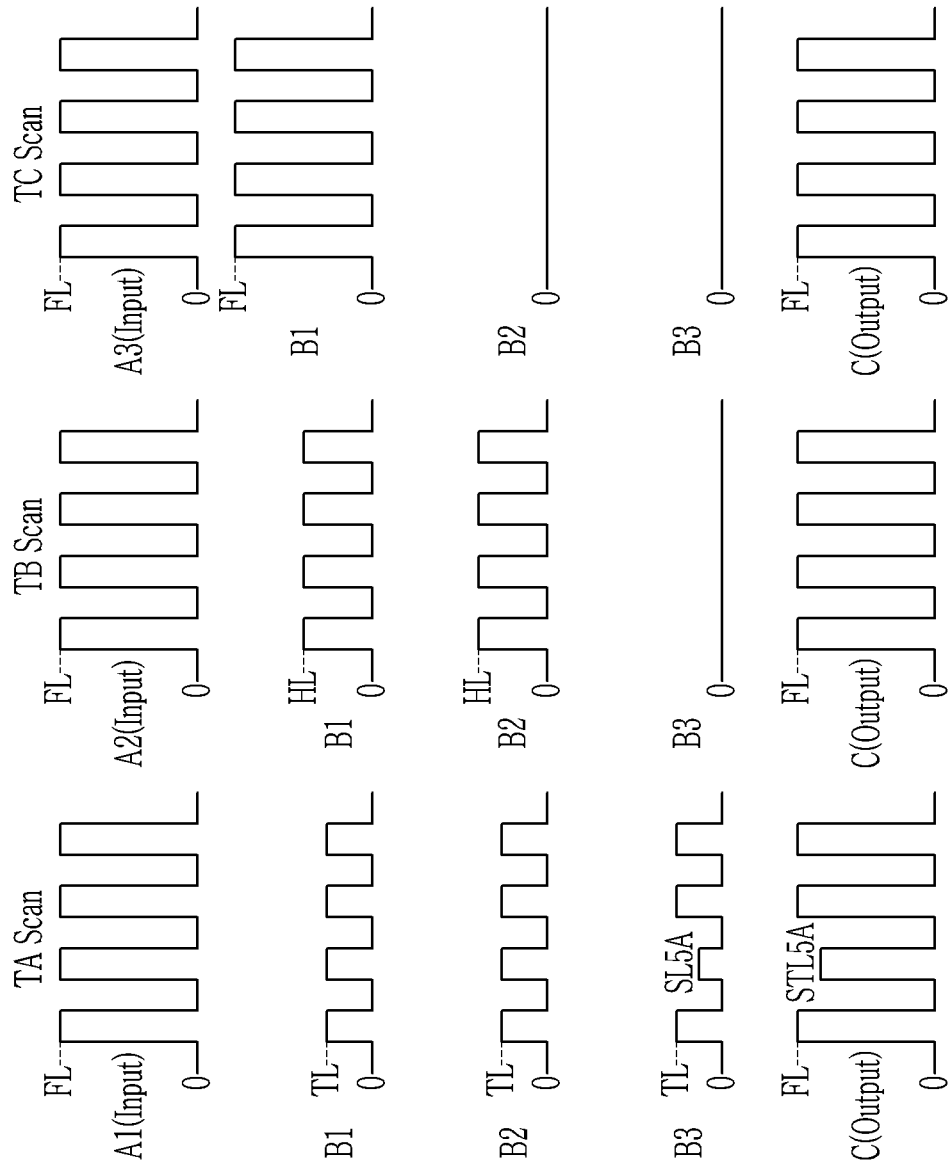
Figure 16:
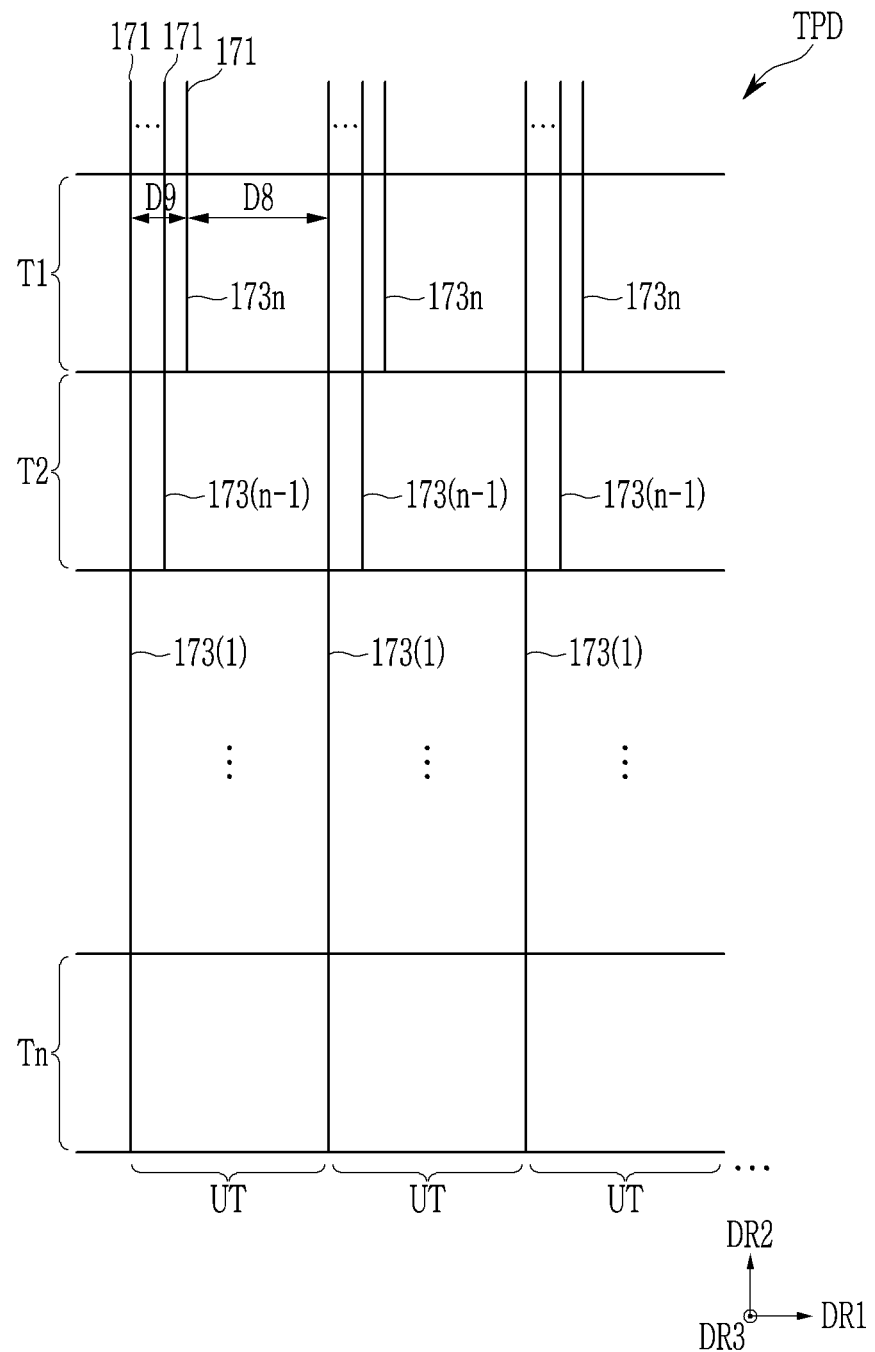
Figure 17:
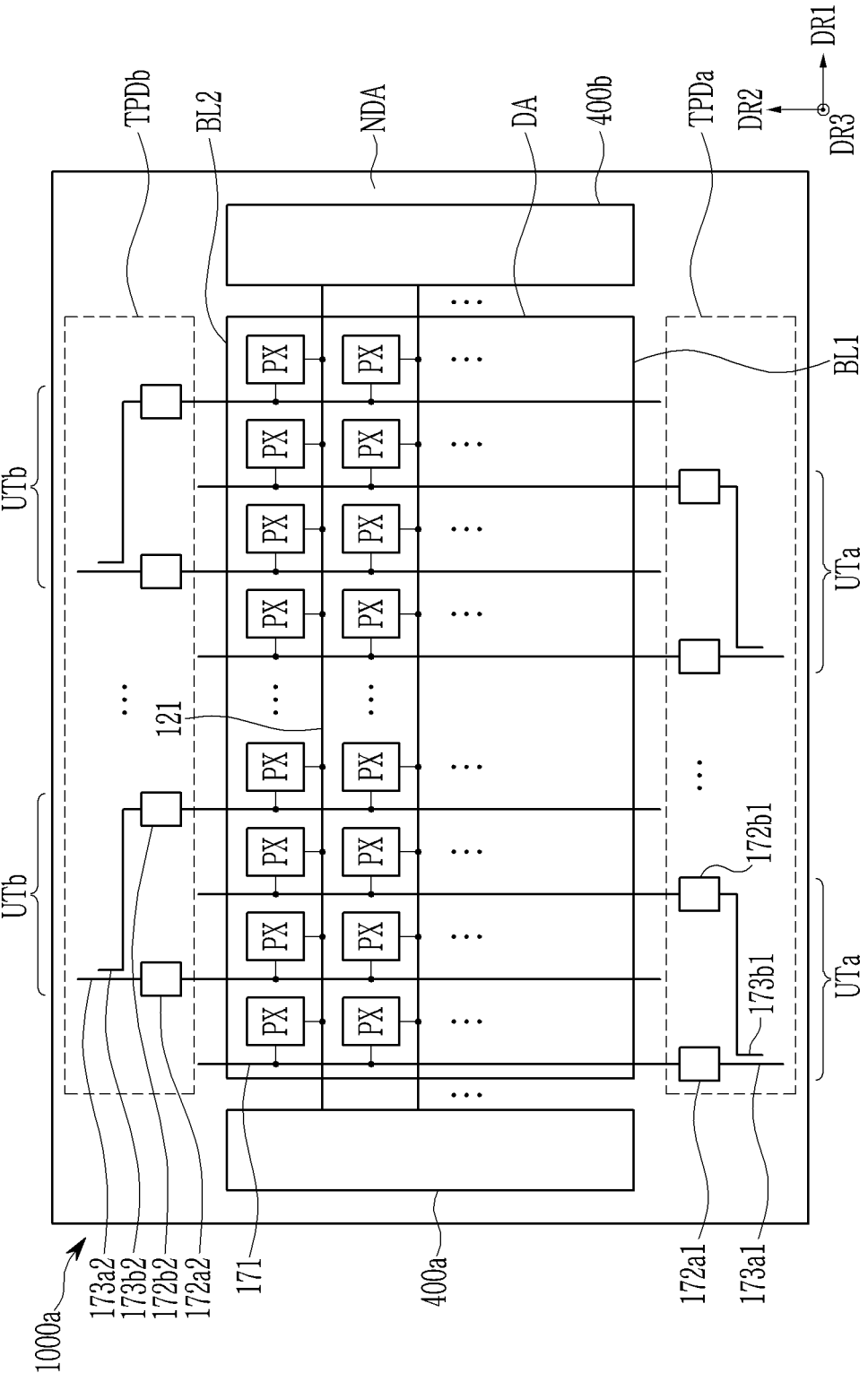
Figure 18:
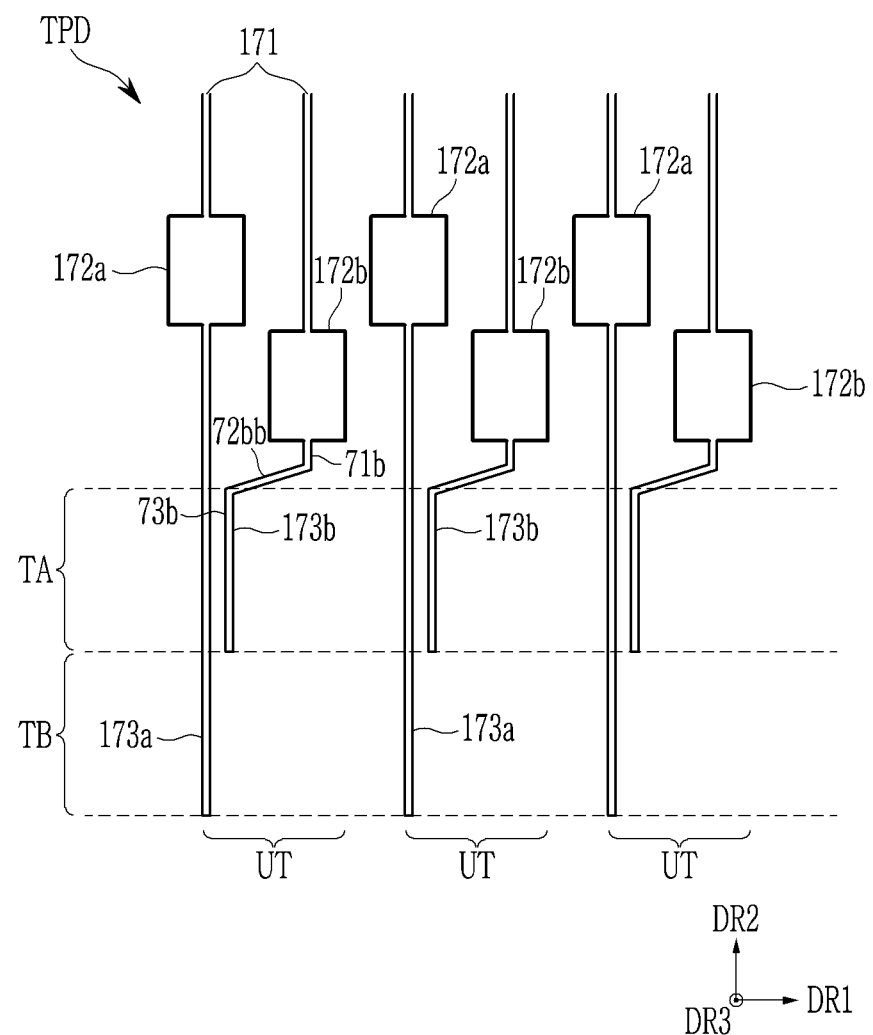
Figure 19:
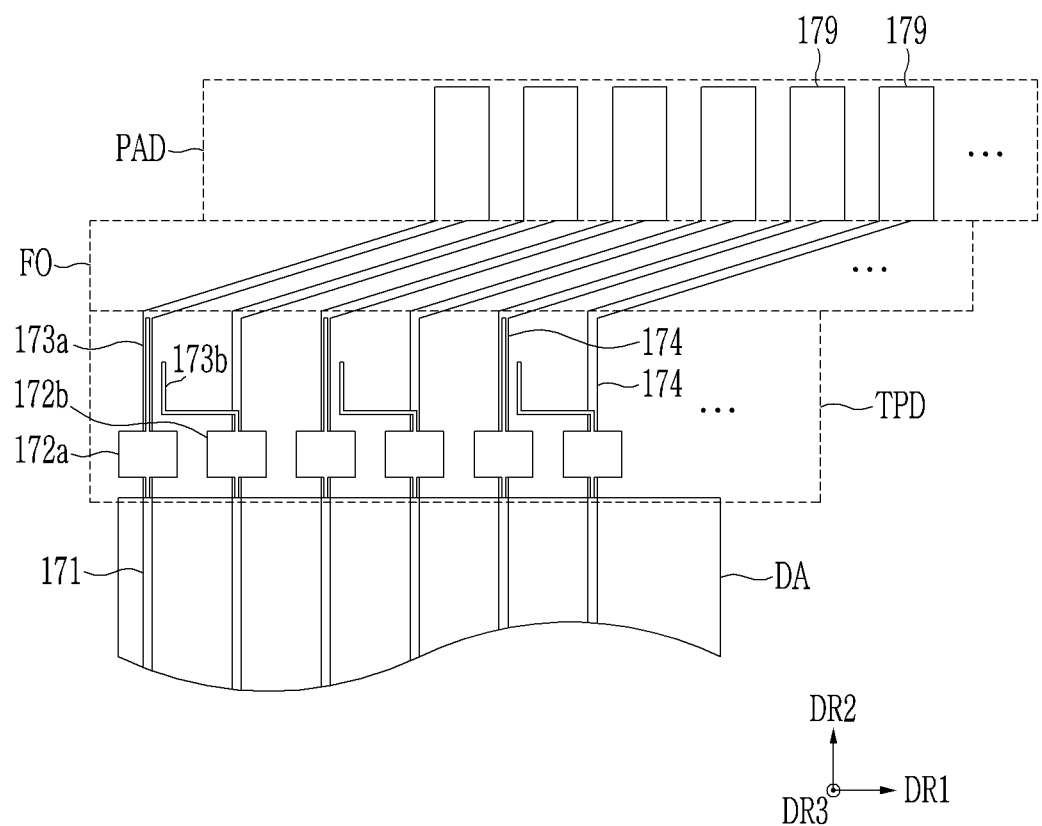

FIG. 15 is a waveform diagram of a signal input in an inspection step of a data line and a signal output when a right data line of adjacent data lines illustrated in FIG. 11 is shorted from a signal line of another conductive layer in the display device according to an embodiment of the present inventive concept;

FIG. 16 illustrates a portion of an inspection unit in the display device according to an embodiment of the present inventive concept;

FIG. 17 is a plan view of a display device according to an embodiment of the present inventive concept;

FIG. 18 illustrates an inspection unit in the display device according to an embodiment of the present inventive concept; and FIG. 19 illustrates portions of an inspection unit and a pad unit of a display device according to an embodiment of the present inventive concept.

DETAILED DESCRIPTION OF THE EMBODIMENTS

The present inventive concept will be described more fully hereinafter with reference to the accompanying drawings, in which various embodiments of the invention are shown. The present inventive concept may be implemented in various different forms and is not limited to embodiments described herein.

A part irrelevant to the description will be omitted to clearly describe the present inventive concept, and the same elements will be designated by the same reference numerals throughout the specification.

In addition, each configuration illustrated in the drawings is arbitrarily shown for understanding and ease of description, but the present inventive concept is not limited thereto. In the drawings, the thickness of layers, films, panels, regions, etc., are exaggerated for clarity. In addition, in the drawings, for convenience of description, thicknesses of a part and an area are exaggeratedly illustrated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, to be referred to as "on" or "on" a reference portion is located above or below the reference portion, and does not particularly mean to "above" or "on" the direction opposite to gravity.

When two or more elements are referred to as "adjacent" to each other, it will be understood that they can be directly adjacent to each other or intervening elements may be present.

Through the specification, unless explicitly described to the contrary, the word "comprise" and variations such as "comprises" or "comprising", will be understood to imply the inclusion of stated elements but not the exclusion of any other elements.

Throughout the specification, a plan view refers to a view that observes a surface parallel to two directions crossing each other (e.g., a first direction DR1 and a second direction DR2) (referred to as a plan phase), and a cross-sectional view means a view that observes a plan taken in a direction (for example, third direction DR3) vertical to a surface parallel to the first direction DR1 and the second direction DR2. In addition, when two components overlap with each other, it means that the two components overlap with each other in the third direction DR3 (for example, in a direction perpendicular to the upper surface of the substrate) unless otherwise stated.

First, a display device according to an embodiment of the present inventive concept will be described with reference to FIGS. 1 and 2.

Figure 1:
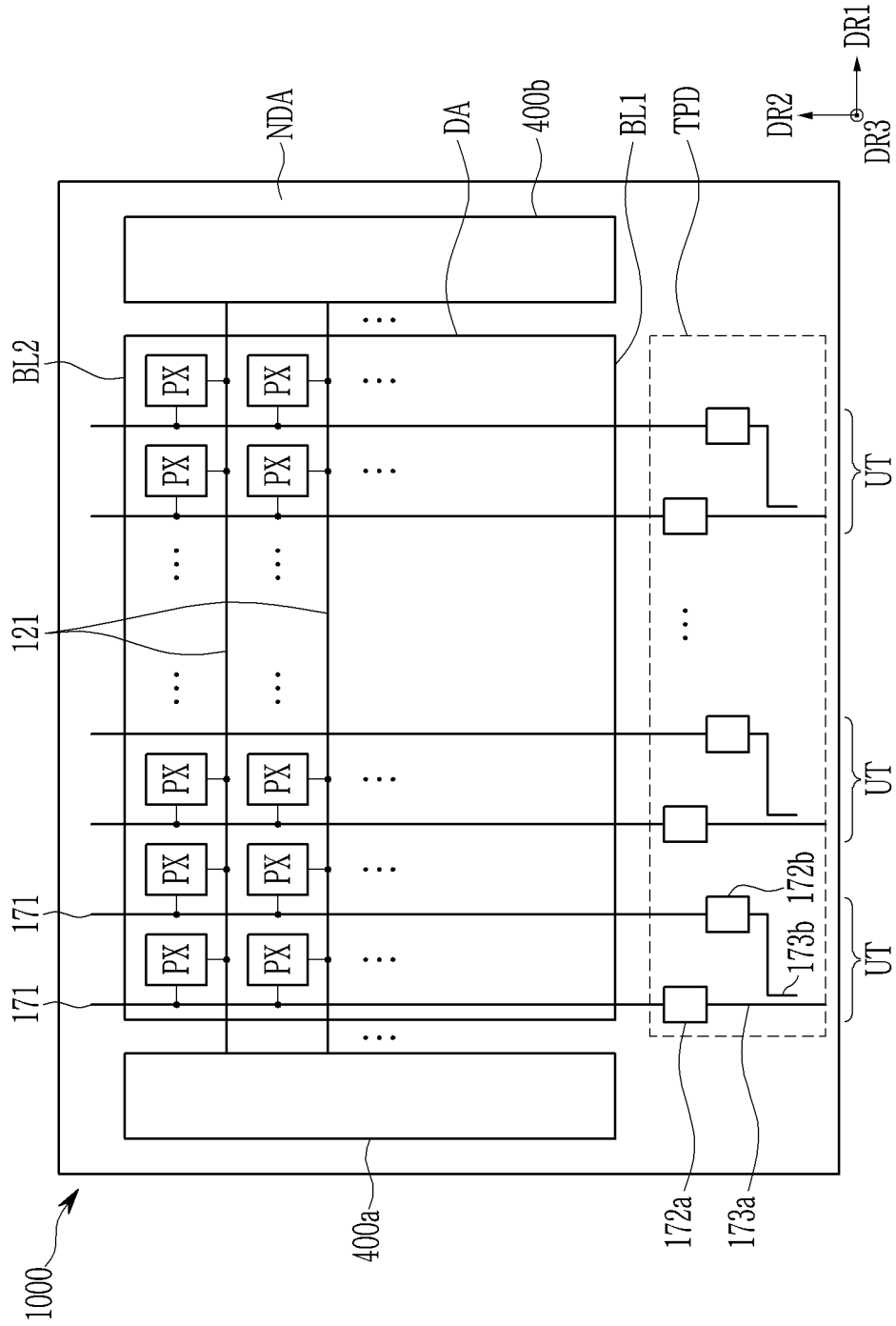
FIG. 1 is a plan view of a display device according to an embodiment of the present inventive concept.
Figure 2:
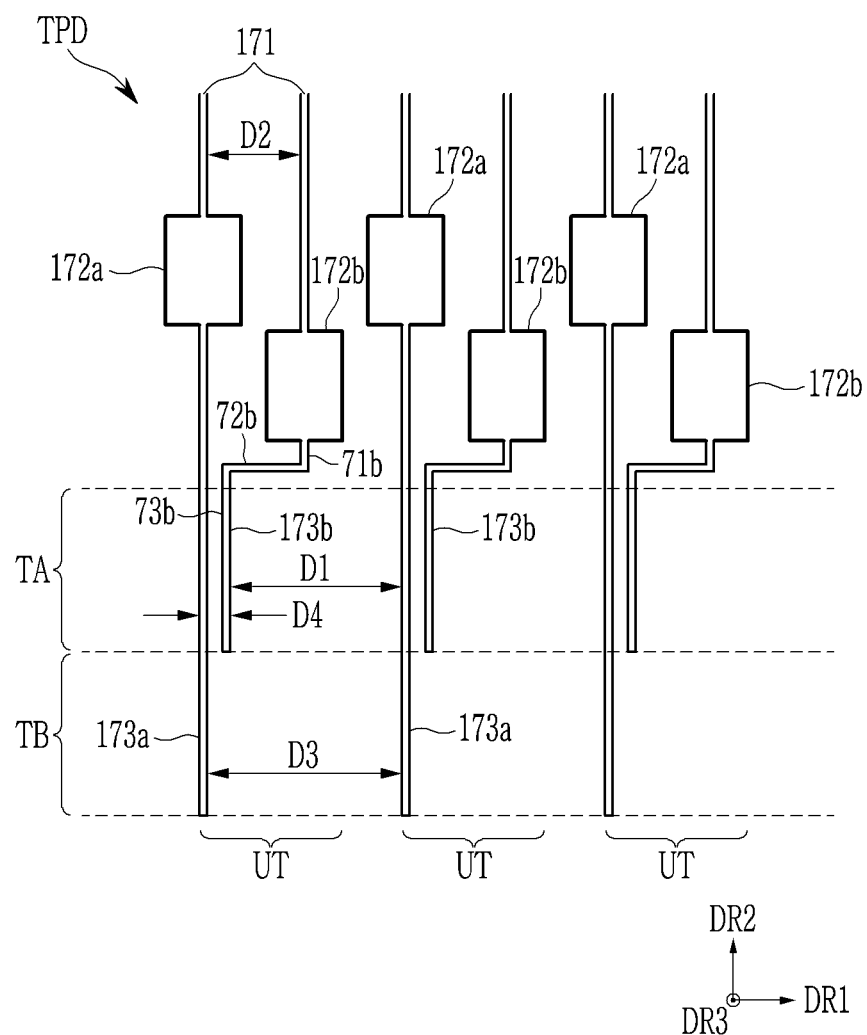
FIG. 2 illustrates a part of an inspection unit of the display device illustrated in FIG. 1.

FIG. 1 is a plan view of a display device according to an embodiment of the present inventive concept and FIG. 2 illustrates a part of an inspection unit of the display device illustrated in FIG. 1.

Referring to FIG. 1, a display device 1000 according to an embodiment of the present inventive concept includes a display area DA which is an area capable of displaying an image, and a non-display area NDA which is positioned around the display area DA and does not display the image.

The display area DA includes a plurality of signal lines and a plurality of pixels PX connected to the plurality of signal lines. The plurality of signal lines may include a plurality of gate lines 121 for transmitting a gate signal and a plurality of data lines 171 for transmitting a data signal.

Each gate line 121 may elongate in the first direction DR1, and each data line 171 may elongate in the second direction DR2 to cross the plurality of gate lines 121. The plurality of gate lines 121 may be sequentially arranged in the second direction DR2, and the plurality of data lines 171 may be sequentially arranged in the first direction DR1.

Each pixel PX is a unit for displaying an image, and may include a pixel circuit unit including at least one thin film transistor connected to the gate line 121 and the data line 171, and a display unit which is connected with the pixel circuit unit and transmits light. For example, when the display device 1000 is a liquid crystal display, the display unit may include two field generation electrodes and a liquid crystal layer positioned between the two field generation electrodes, and when the display device 1000 is a light emitting diode display, the display unit may include a pixel electrode, a common electrode, and a light emitting layer positioned therebetween.

In the non-display area NDA, gate drivers 400a and 400b capable of generating a gate signal and an inspection unit TPD may be positioned.

The gate drivers 400a and 400b may be connected to the plurality of gate lines 121 to apply a gate signal to the gate lines 121. The gate signal may transmit a gate on voltage and a gate off voltage to the gate electrode of the thin film transistor included in the pixel circuit unit of the pixel PX. The gate drivers 400a and 400b may be formed together in the same process as the thin film transistor positioned in the display area DA. As illustrated in FIG. 1, the gate drivers 400a and 400b may be respectively positioned on left and right sides of the display area DA, and one of the two gate drivers 400a and 400b may be omitted.

The inspection unit TPD is a portion for inspecting whether a signal line in the display area DA is defective, and for example, the inspection unit TPD may be positioned on and/or below the display area DA, but is not limited thereto. FIG. 1 illustrates an example in which the inspection unit TPD is positioned at one side below the display area DA. For example, the inspection unit TPD may be positioned in the non-display area NDA. In the present description, it is described as an example that the inspection unit TPD is used to inspect whether the plurality of data lines 171 is defective, but is not limited thereto. The inspection unit TPD may be configured as a portion for inspecting whether other signal lines such as the gate lines 121 are defective.

The plurality of data lines 171 extends to the non-display area NDA positioned outside a first edge BL1 of the display area DA and includes a portion positioned in the inspection unit TPD. Each data line 171 positioned in the inspection unit TPD includes expansions 172a and 172b and inspection lines 173a and 173b connected to the expansions 172a and 172b.

The expansions 172a and 172b of the plurality of data lines 171 may be alternately positioned in the plurality of rows as illustrated in FIG. 1. Each row extends in the first direction DR1. For example, the expansions 172a and 172b of the plurality of data lines 171 may be alternately positioned in two rows. In this case, the expansions 172a and 172b of two adjacent data lines 171 may be misaligned in the first direction DR1 (i.e., the expansions 172a and 172b do not overlap in the first direction DR1). In other embodiments, the expansions 172a and 172b of the plurality of data lines 171 may be arranged in line in one row or may be alternately arranged in three or more rows.

Each of the expansions 172a and 172b may have a substantially rectangular shape, but are not limited thereto.

According to another embodiment of the present inventive concept, the expansions 172a and 172b of the data lines 171 may be omitted.

The plurality of data lines 171 may be divided into a plurality of groups UT repeatedly arranged in the first direction DR1. Each group UT may include two or more data lines 171, and the inspection lines 173a and 173b of the data lines 171 of each group UT may have different shapes.

FIGS. 1 and 2 illustrate an example in which each group UT includes two adjacent data lines 171. One data line 171 of two data lines 171 included in each group UT includes a first expansion 172a and a first inspection line 173a connected to the first expansion 172a, and the other data line 171 may include a second expansion 172b and a second inspection line 173b connected to the second expansion 172b.

Referring to FIG. 2, the inspection unit TPD according to an embodiment may include a first inspection area TA positioned below the area where the expansions 172a and 172b are arranged, and a second inspection area TB which is positioned below the first inspection area TA and adjacent to the first inspection area TA in the second direction DR2. That is, the expansions 172a and 172b may be positioned between the first edge BL1 of the display area DA and the first inspection area TA.

The first inspection line 173a extends from the first expansion 172a in substantially the second direction DR2 to extend to the first inspection area TA and the second inspection area TB. Accordingly, the first inspection line 173a may include an end portion positioned near a lower end of the second inspection area TB.

The second inspection line 173b may include a first portion 71b extending substantially in the second direction DR2 below the second expansion 172b, a second portion 72b extending toward the first inspection line 173a after bending from the first portion 71b toward the first inspection line 173a, and a third portion 73b extending toward the second direction DR2 again after bending from the second portion 72b. As illustrated in FIG. 2, the second portion 72b may extend substantially parallel to the first direction DR1, or alternatively, may extend in a direction oblique to the first direction DR1 and the second direction DR2. The third portion 73b may extend substantially parallel to the first inspection line 173a in the first inspection area TA. The second inspection line 173b may include an end portion which is not positioned in the second inspection area TB but positioned near a boundary between the first inspection area TA and the second inspection area TB.

That is, in each group UT, the end portion of the first inspection line 173a and the end portion of the second inspection line 173b are not aligned in the first direction DR1 but are spaced apart from each other in the second direction DR2. Accordingly, both of the inspection lines 173a and 173b included in each group UT may be positioned in the first inspection area TA, but only one inspection line 173a may be positioned in the second inspection area TB.

The first inspection line 173a and the second inspection line 173b may be alternately arranged in the first direction DR1. In this case, an odd-numbered data line 171 may include the first inspection line 173a and an even-numbered data line 171 may include the second inspection line 173b.

A total length of the first inspection line 173a and a total length of the second inspection line 173b may be the same as each other (e.g. when summing up the lengths of each portion of the inspection line rather than just measuring the length along one of direction DR1, DR2, and DR3).

A distance D1 between the second inspection line 173b located at a right edge of the left group UT of the two adjacent groups UT and the first inspection line 173a located at a left edge of the right group UT thereof may be greater than a distance D2 between two adjacent data lines 171 in the display area DA of the high-resolution display device 1000 (e.g., where the distance D2 is between portions of the two adjacent data lines 171 in the display area DA). That is, the distance D1 between the two inspection lines 173a and 173b respectively positioned in two adjacent groups UT in the first inspection area TA and facing each other may be greater than the distance D2 between the two adjacent data lines 171 in the display area DA.

In the second inspection area TB, a distance D3 between two first inspection lines 173a positioned in two adjacent groups UT, respectively and facing each other may be greater than the distance D2 between the two adjacent data lines 171 in the display area DA and may be twice greater than the distance D2.

A distance D4 between two outer edges of the two inspection lines 173a and 173b positioned at the left and right edges of the inspection lines 173a and 173b positioned in one group UT may be smaller than the distance D2 between the two adjacent data lines 171 in the display area DA.

The expansions 172a and 172b and the inspection lines 173a and 173b may be disposed on the same conductive layer on a substrate and include the same material. In addition, the expansions 172a and 172b and the inspection lines 173a and 173b may be located on the same conductive layer as the data lines 171 positioned in the display area DA and include the same material, and may be positioned on a different conductive layer from the data lines 171.

The arrangement order of the inspection lines 173a and 173b positioned in each group UT may be different from that illustrated in the drawings.

Next, an inspection method for inspecting a data line in a manufacturing process of a display device according to an embodiment of the present inventive concept will be described with reference to FIGS. 3 and 4 together with FIGS. 1 and 2 described above.

Figure 3:
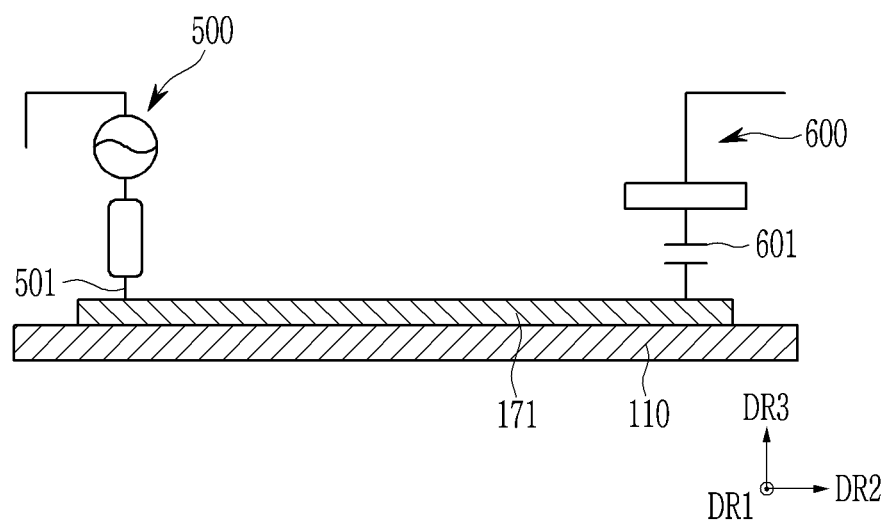
FIG. 3 is a diagram illustrating an inspection device and a sensor device for inspecting data lines of a display device according to an embodiment of the present inventive concept.
Figure 4:
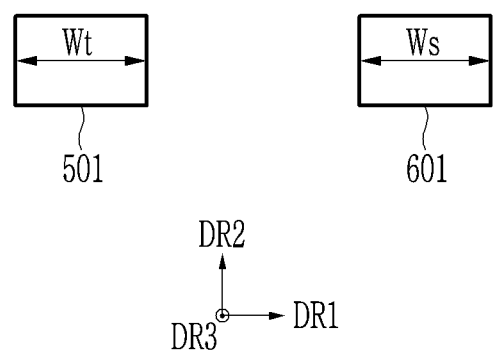
FIG. 4 illustrates an inspection pin and a bottom surface of a sensor pad of the inspection device illustrated in FIG. 3.

FIG. 3 is a diagram illustrating an inspection device and a sensor device for inspecting data lines of a display device according to an embodiment of the present inventive concept and FIG. 4 illustrates an inspection pin and a bottom surface of a sensor pad of the inspection device illustrated in FIG. 3.

Referring to FIG. 3, a plurality of data lines 171 is formed on the substrate 110 of the display device, and although not illustrated, after the gate line 121, the pixel circuit unit, and the display unit described above are formed on the substrate 110, inspection for whether the data line 171 is defective may be performed.

When the data line 171 extends in the second direction DR2, the inspection device 500 scans the inspection lines 173a and 173b of the plurality of data lines 171 in the first direction DR1 when the data lines 171 are inspected to detect a position of the defective data line 171. While scanning the inspection lines 173a and 173b of the plurality of data lines 171, the inspection device 500 may apply an input signal, which is an AC signal, to the inspection lines 173a and 173b of the data line 171 through an inspection pin 501.

While the inspection device 500 is scanning, a sensor device 600 scanning a portion of the plurality of data lines 171 to be inspected in the first direction DR1 measures potentials of the plurality of data lines 171 to generate an output signal. A conductive sensor pad 601 of the sensor device 600 may measure the potential of the portion of the data line 171 to be inspected by a non-contact method. A portion of the data line 171 at which the inspection device 500 measures the potential is a portion of the data line 171 where the expansions 172a and 172b and the inspection lines 173a and 173b are not positioned. For example, the portion of the data line 171 may be a portion of the data line 171 positioned near an opposite second edge BL2 facing the first edge BL1 of the display area DA illustrated in FIG. 1 and may also be a portion of the data line 171 extending to the non-display area NDA positioned outside the second edge BL2.

Referring to FIGS. 2 and 4, both the distance D1 between the two inspection lines 173a and 173b respectively positioned in two adjacent groups UT in the first inspection area TA and facing each other and the distance D3 between the two first inspection lines 173a positioned in two adjacent groups UT, respectively in the second inspection area TB and facing each other, may be larger than a width Wt of the first direction DR1 of the inspection pin 501 of the inspection device 500. Therefore, when the data line 171 is inspected, the inspection device 500 may apply an input signal by distinguishing two adjacent groups UT from each other and detect which group of data line 171 is defective.

In addition, the width Wt of the first direction DR1 of the inspection pin 501 of the inspection device 500 is larger than the distance D4 between the two outer edges of the two inspection lines 173a and 173b positioned at the left and right edges of the inspection lines 173a and 173b positioned in one group UT. That is, the width Wt of the first direction DR1 of the inspection pin 501 of the inspection device 500 is larger than the distance D4 between the left and right edges of all inspection lines 173a and 173b positioned in the first inspection area TA of one group UT. Therefore, when inspecting the data line 171, the inspection device 500 may apply one input signal simultaneously without distinguishing the plurality of inspection lines 173a and 173b located in one group UT, and thus, may apply the input signal to all of the inspection lines 173a and 173b belonging to one group UT as if they were one inspection line.

That is, when the inspection device 500 scans a group UT, the inspection pin 501 and all inspection lines 173a and 173b of the group UT are shorted to each other and the input signal may be applied simultaneously to the inspection lines 173a and 173b of the group UT.

According to the embodiment of the present inventive concept, when the width Wt of the first direction DR1 of the inspection pin 501 is substantially 50 micrometers, both the distance D1 between the two inspection lines 173a and 173b respectively positioned in two adjacent groups UT in the first inspection area TA and facing each other and the distance D3 between the two first inspection lines 173a positioned in two adjacent groups UT in the second inspection area TB, respectively and facing each other may be larger than substantially 50 micrometers. In addition, the distance D4 between the two outer edges of the two inspection lines 173a and 173b positioned at the left and right edges of the inspection lines 173a and 173b positioned in one group UT may be about 50 micrometers or less.

In addition, the width Wt of the first direction DR1 of the inspection pin 501 may be greater than the distance D2 between the two adjacent data lines 171 in the display area DA.

Referring to FIG. 4, a width Ws of the first direction DR1 of the sensor pad 601 of the sensor device 600 according to an embodiment may be larger than or equal to and smaller than a distance between two adjacent data lines 171 at a portion where the sensor device 600 measures the potential. If the width Ws of the first direction DR1 of the sensor pad 601 is greater than or equal to the distance between two adjacent data lines 171 at the portion at which the potential is measured, in the inspection of the data line 171, the sensor device 600 does not detect the defective data line 171 by distinguishing each data line 171, and may detect one potential for two or more adjacent data lines 171. Accordingly, the sensor device 600 may detect a region where the defective data line 171 is located, and contact the inspection pin to the expansions 172a and 172b and apply voltage to the expansion 172a and 172b and perform the detecting of the defective data line 171 later in order to detect the defective data line 171.

In the present description, for convenience of explanation and understanding, it is described that the width Ws of the first direction DR1 of the sensor pad 601 is smaller than the distance between the adjacent data lines 171 to be detected.

Next, a detailed inspection method for a data line of a display device according to an embodiment of the present inventive concept will be described with reference to FIGS. 5 to 12 together with the drawings described above.

Figure 5:
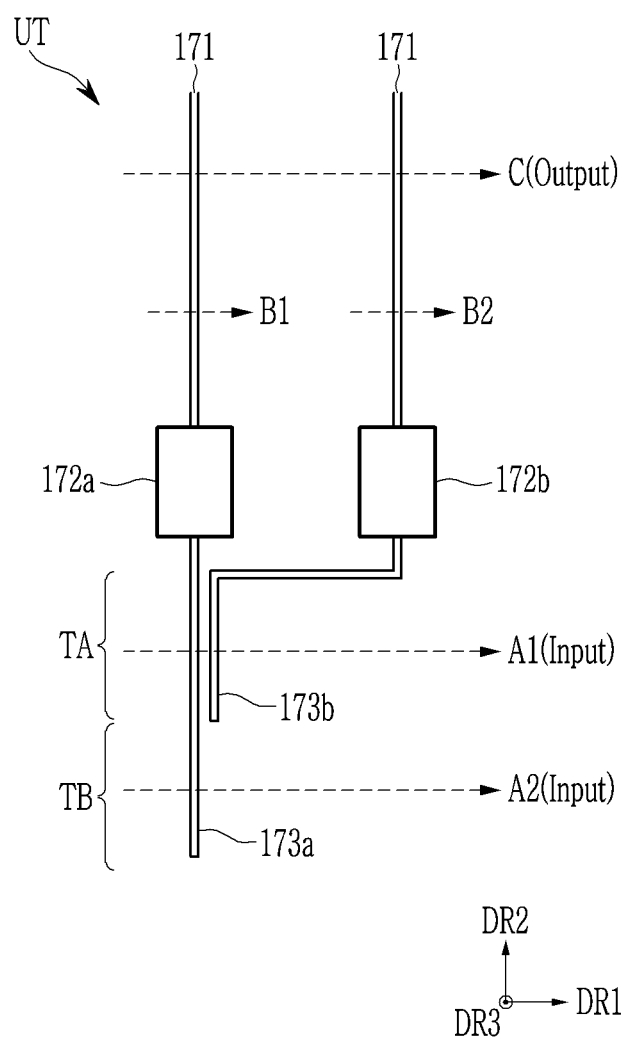
FIG. 5 illustrates a portion of an inspection unit of a display device according to an embodiment of the present inventive concept.
Figure 6:
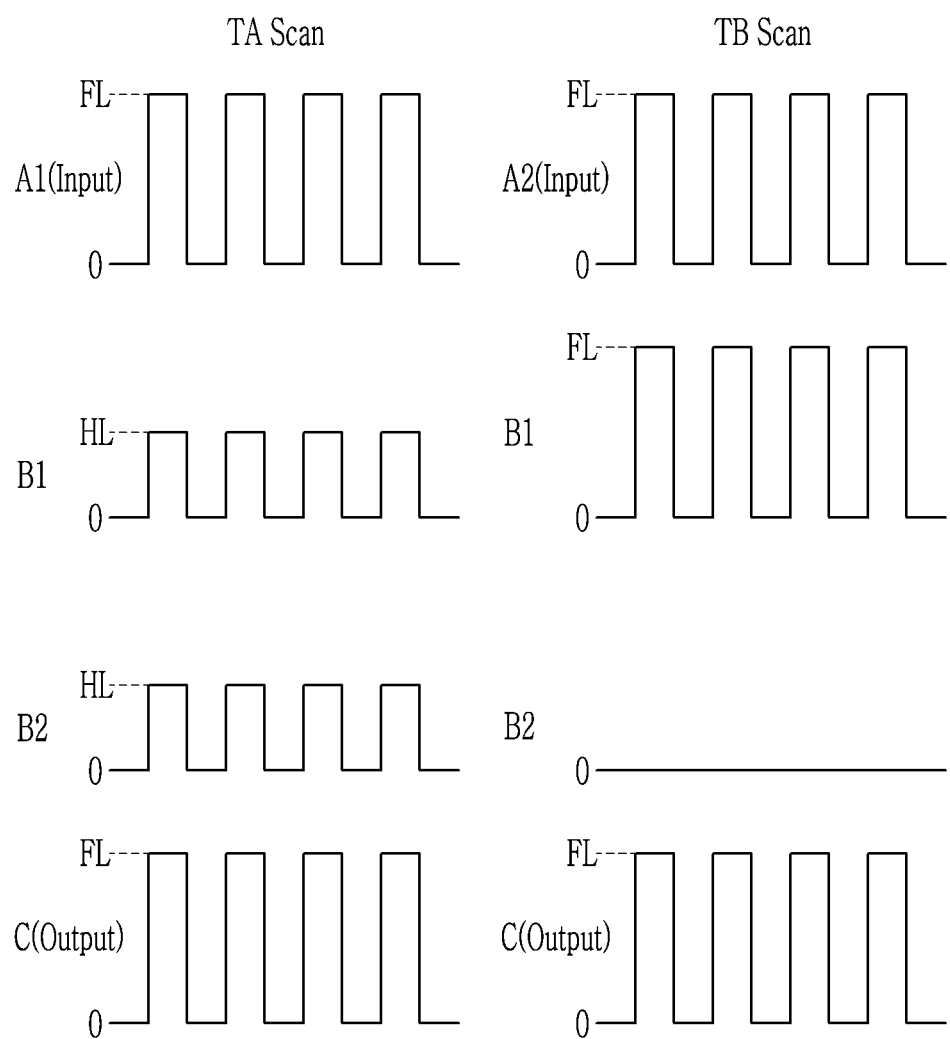
FIG. 6 is a waveform diagram of a signal input in an inspection step of a data line and a signal output when the data line is normal in a display device according to an embodiment of the present inventive concept.

FIG. 5 illustrates a portion of an inspection unit of a display device according to an embodiment of the present inventive concept and FIG. 6 is a waveform diagram of a signal input in an inspection step of a data line and a signal output when the data line is normal in a display device according to an embodiment of the present inventive concept.

Referring to FIG. 5, an inspection method of the data line of the display device according to an embodiment of the present inventive concept includes a first scan inspection TA Scan which applies an input signal A1 to the inspection lines 173a and 173b by scanning in the first direction DR1 with respect to the first inspection area TA of the inspection unit TPD as illustrated in FIGS. 1 and 2 described above and a second scan inspection TB Scan which applies an input signal A2 to the first inspection line 173a by scanning in the first direction DR1 with respect to the second inspection area TB.

The first scan inspection TA Scan and the second scan inspection TB Scan may be performed by the inspection device 500 described above. The order of the first scan inspection TA Scan and the second scan inspection TB Scan may be changed.

In each of the first scan inspection TA Scan and the second scan inspection TB Scan, an output signal C may be obtained by measuring the potential of the data line 171 using the sensor device 600 illustrated in FIG. 3 described above. In the following description, when input signals A1 and A2 are inputted to the inspection lines 173a and 173b of the data line 171 to help the understanding of the output signal C, signals B1 and B2 indicating the potentials of the data lines 171 are also checked. The output signal C is a signal that may be actually detected as an output signal in which the two signals B1 and B2 are combined.

A waveform of an output signal when the data lines 171 to be inspected are all normal will be described with reference to FIG. 6.

First, in the first scan inspection TA Scan, an input signal A1, which is an AC signal, is applied to the first and second inspection lines 173a and 173b of the data lines 171 of the first inspection area TA. A low level of the input signal A1 is represented by 0 and a high level thereof is represented by a first level FL. As described above, when the inspection device 500 scans a group UT, the inspection pin 501 and all the inspection lines 173a and 173b of the group UT are shorted from each other and the input signal A1 may be applied simultaneously to the inspection lines 173a and 173b of the group UT.

Then, a signal B1 of the data line 171 including the first inspection line 173a and a signal B2 of the data line 171 including the second inspection line 173b may have a second level HL lower than the first level FL, respectively. Assuming that there is no element such as voltage drop such as resistance or leakage current, the second level HL may be, for example, approximately half of the first level FL. The output signal C detected by the sensor pad 601 of the sensor device 600 may be approximately the first level FL as a level obtained by adding potentials of the two signals B1 and B2.

In the present description, it is assumed that there are no elements such as voltage drop due to resistance, leakage current, etc., but a voltage level of the output signal C is illustrated to be the same as the first level FL of the input signal A1, but the voltage level of the output signal C may be different from the first level FL. In addition, as described above, the second level HL may be approximately half of the first level FL, and may be lower than the first level FL.

Next, in the second scan inspection TB Scan, the input signal A2 is applied to the first inspection line 173a of the data lines 171 of the second inspection area TB. The input signal A2 may be the same as the input signal A1 in the first scan inspection TA Scan. In the second scan inspection TB Scan, since the input signal A2 is not applied to the second inspection line 173b, the signal B2 of the data line 171 including the second inspection line 173b is 0, and the signal B1 of the data line 171 including the first inspection line 173a may be equal to the first level FL. Therefore, the output signal C detected by the sensor pad 601 of the sensor device 600 may be approximately the first level FL as a level obtained by adding the potentials of the two signals B1 and B2.

Now, referring to FIG. 7 based on the normal waveform illustrated in FIG. 6, a case where a short failure in the left data line 171 of the two data lines 171 illustrated in FIG. 5, for example, a defect shorted from another conductive layer like the gate line 121, occurs and the right data line 171 is normal will be described.

Figure 7:
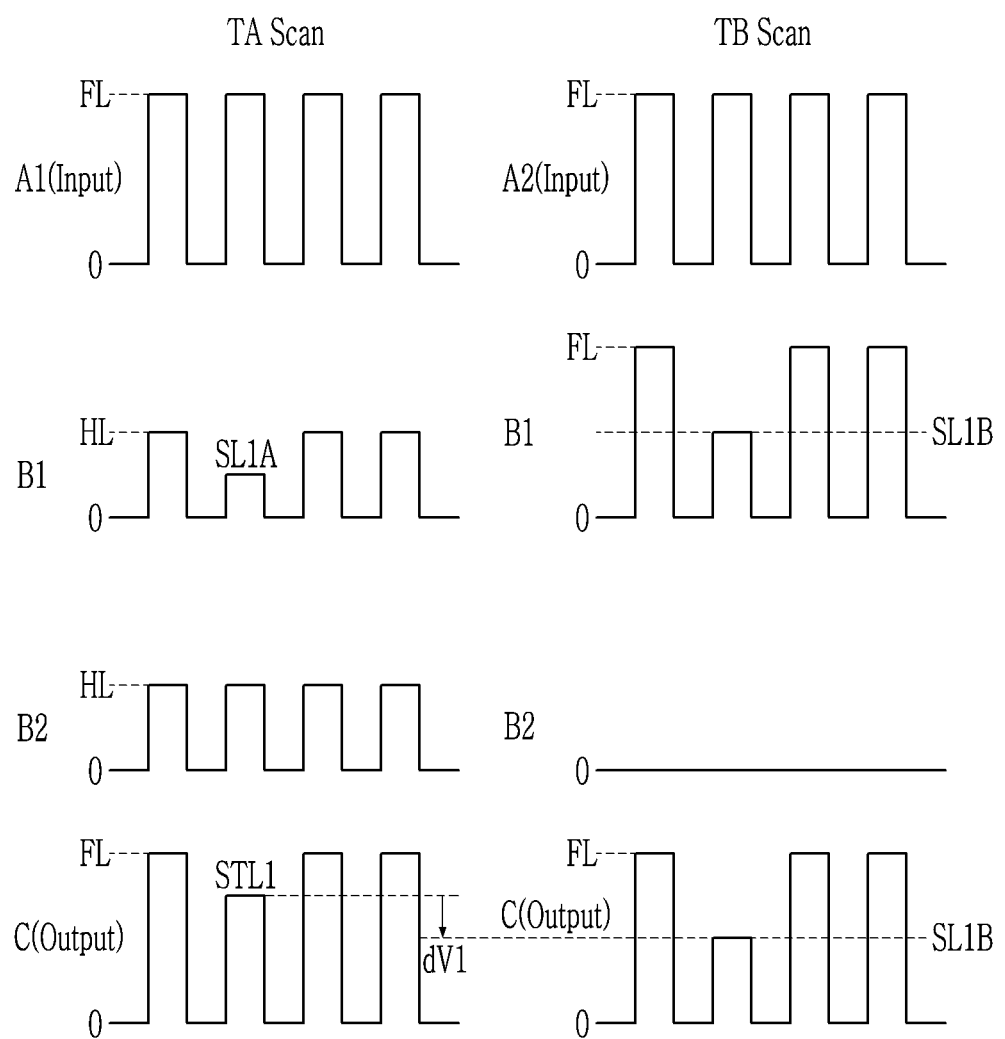
FIG. 7 is a waveform diagram of a signal input in an inspection step of a data line and a signal output when a left data line of adjacent data lines illustrated in FIG. 5 is shorted from a signal line of another conductive layer in the display device according to an embodiment of the present inventive concept.

FIG. 7 is a waveform diagram of a signal input in an inspection step of a data line and a signal output when a left data line 171 of adjacent data lines 171 illustrated in FIG. 5 is shorted from a signal line of another conductive layer in the display device according to an embodiment of the present inventive concept.

Referring to FIG. 7, in the first scan inspection TA Scan, when the input signal A1 is applied to the first and second inspection lines 173a and 173b of the data lines 171 of the first inspection area TA, the signal B1 of the data line 171 including the first inspection line 173a has a level SL1A lower than the second level HL at a timing when the defective data line 171 is scanned (a second pulse from the left of the signal B1 in FIG. 7) and the signal B2 of the data line 171 including the second inspection line 173b may have approximately the second level HL like the normal waveform of FIG. 6. The output signal C detected by the sensor pad 601 of the sensor device 600 may have a level STL1 which is lower than the first level FL and higher than the second level HL at the timing when the defective data line 171 is scanned as a result obtained by adding the potentials of the two signals B1 and B2.

Next, in the second scan inspection TB Scan, when the input signal A2 is applied to the first inspection line 173a of the data lines 171 of the second inspection area TB, the signal B2 of the data line 171 including the second inspection line 173b is 0, and the signal B1 of the data line 171 including the first inspection line 173a may have a level SL1B lower than the first level FL at the timing when the defective data line 171 is scanned (a second pulse from the left of the signal B1 in FIG. 7). Therefore, the output signal C detected by the sensor pad 601 of the sensor device 600 may have a level SL1B which is lower than the first level FL and higher than 0 at the timing when the defective data line 171 is scanned as a result obtained by adding the potentials of the two signals B1 and B2.

Here, the voltage level SL1B of the output signal C in the second scan inspection TB Scan may be smaller than the voltage level STL1 of the output signal C in the first scan inspection TA Scan by a potential difference dV1. The potential difference dV1 is larger than 0.

Next, referring to FIG. 8 based on the normal waveform illustrated in FIG. 6, a case where a defect in the right data line 171 of the two data lines 171 illustrated in FIG. 5, for example, a defect shorted from another conductive layer like the gate line 121, occurs and the left data line 171 is normal will be described.

Figure 8:
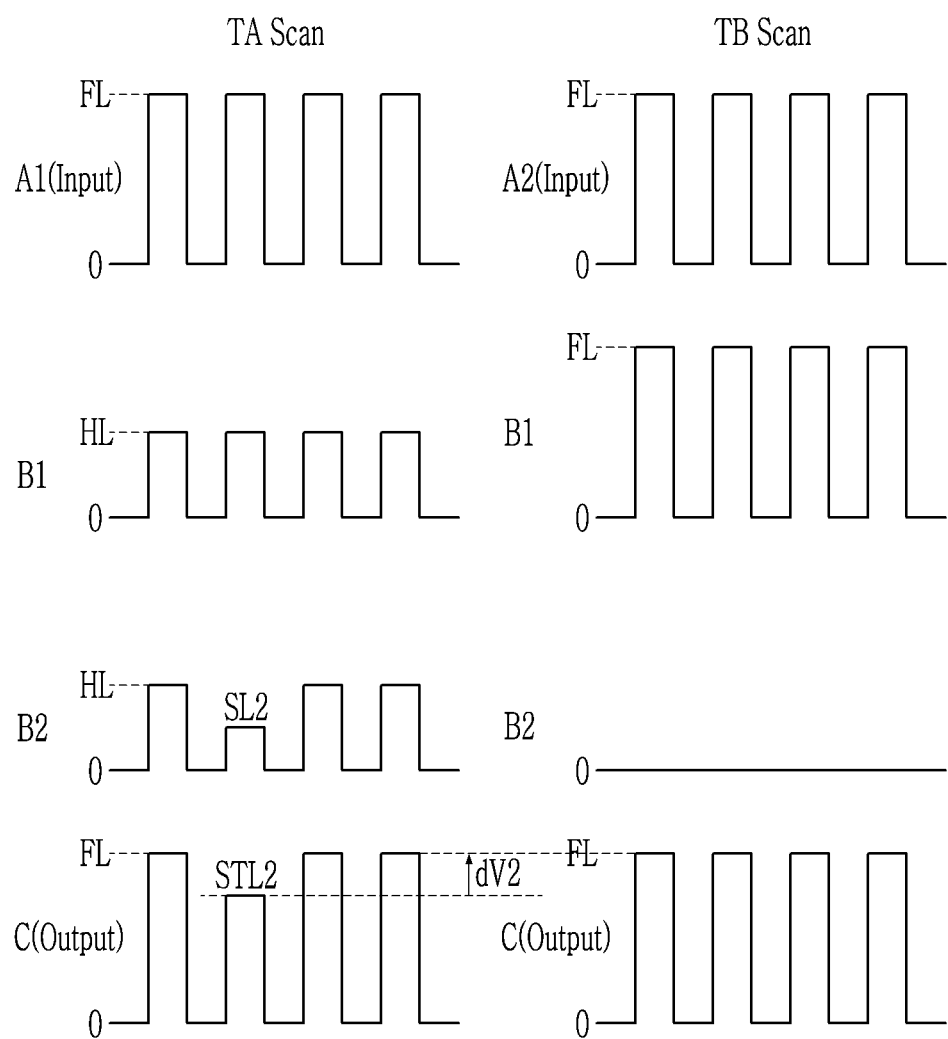
FIG. 8 is a waveform diagram of a signal input in an inspection step of a data line and a signal output when a right data line of adjacent data lines illustrated in FIG. 5 is shorted from a signal line of another conductive layer in the display device according to an embodiment of the present inventive concept.

FIG. 8 is a waveform diagram of a signal input in an inspection step of a data line and a signal output when a right data line of adjacent data lines illustrated in FIG. 5 is shorted from a signal line of another conductive layer in the display device according to an embodiment of the present inventive concept.

Referring to FIG. 8, in the first scan inspection TA Scan, when the input signal A1 is applied to the first and second inspection lines 173a and 173b of the data lines 171 of the first inspection area TA, the signal B1 of the data line 171 including the first inspection line 173a has the second level HL like the normal waveform of FIG. 6 and the signal B2 of the data line 171 including the second inspection line 173b may have a level SL2 lower than the second level HL at a timing when the defective data line 171 is scanned (a second pulse from the left of the signal B2 in FIG. 8). The output signal C detected by the sensor pad 601 of the sensor device 600 may have a level STL2 which is lower than the first level FL and higher than the second level HL at the timing when the defective data line 171 is scanned as a result obtained by adding the potentials of the two signals B1 and B2.

Next, in the second scan inspection TB Scan, when the input signal A2 is applied to the first inspection line 173a of the data lines 171 of the second inspection area TB, the signal B2 of the data line 171 including the second inspection line 173b is 0, and the signal B1 of the data line 171 including the first inspection line 173a may have approximately the first level FL like the normal waveform of FIG. 6. The output signal C detected by the sensor pad 601 of the sensor device 600 may have approximately the first level FL like the normal waveform of FIG. 6 as a result obtained by adding potentials of the two signals B1 and B2.

Here, the first level FL, a voltage level of the output signal C in the second scan inspection TB Scan may be larger than the voltage level STL2 corresponding to the defective data line 171 of the output signal C in the first scan inspection TA Scan by a potential difference dV2. The potential difference dV2 is larger than 0.

According to the display device according to the embodiment, two inspection lines 173a and 173b positioned in the inspection unit TPD form a group UT, and the number of inspection lines 173a and 173b located in the first inspection area TA and the second inspection area TB may be differently configured in each group UT. In the display device, as described above, when describing the output signal C for the first and second scan inspections TA Scan and TB Scan detected by inspecting the data lines, a waveform of the output signal C of FIG. 7, which is a case where the left data line 171 of two adjacent data lines 171 illustrated in FIG. 5 is defective, is distinguished from a waveform of the output signal C of FIG. 8, which is a case where the right data line 171 of two adjacent data lines 171, illustrated in FIG. 5 is defective. Further, it is possible to detect which data line 171 is defective by the potential differences dV1 and dV2 between the voltage level of the output signal C in the first scan inspection TA Scan and the voltage level of the output signal C in the second scan inspection TB Scan.

Therefore, it is possible to rapidly and accurately inspect which data line 171 of the two adjacent data lines 171 illustrated in FIG. 5 is defective by the waveform of the output signal C obtained by the first scan inspection TA Scan and the second scan inspection TB Scan for the first inspection area TA and the second inspection area TB and/or information on the potential differences dV1 and dV2.

In a high-resolution display device, when the distance between the data lines 171 becomes narrower and thus the distance between the adjacent data lines 171 also becomes smaller in the inspection unit TPD, if the inspection lines 173a and 173b all equally extend in the second direction DR2, the distance between the adjacent inspection lines 173a and 173b may be equal to or smaller than the distance between the adjacent data lines 171 in the display area DA. Then, the width Wt of the first direction DR1 of the inspection pin 501 of the inspection device 500 may be larger than the distance between the adjacent inspection lines 173a and 173b, and which data line 171 of the two adjacent data lines 171 has is defective cannot be distinguished.

However, according to the embodiment, in a high-resolution display device, even when the width Wt of the first direction DR1 of the inspection pin 501 of the inspection device 500 is larger than the distance between the adjacent data lines 171 in the display area DA, it is possible to rapidly and accurately inspect which data line 171 is defective by the waveform of the output signal C obtained by the first scan inspection TA Scan and the second scan inspection TB Scan for the first inspection area TA and the second inspection area TB, respectively and/or information on the potential differences dV1 and dV2, thereby preventing a yield of the display device from being defective.

According to the embodiment, it is possible to check which group UT has a defective data line 171 through the first scan inspection TA Scan and to check which data line 171 of each group UT is defective through the second scan inspection TB Scan.

Figure 9:
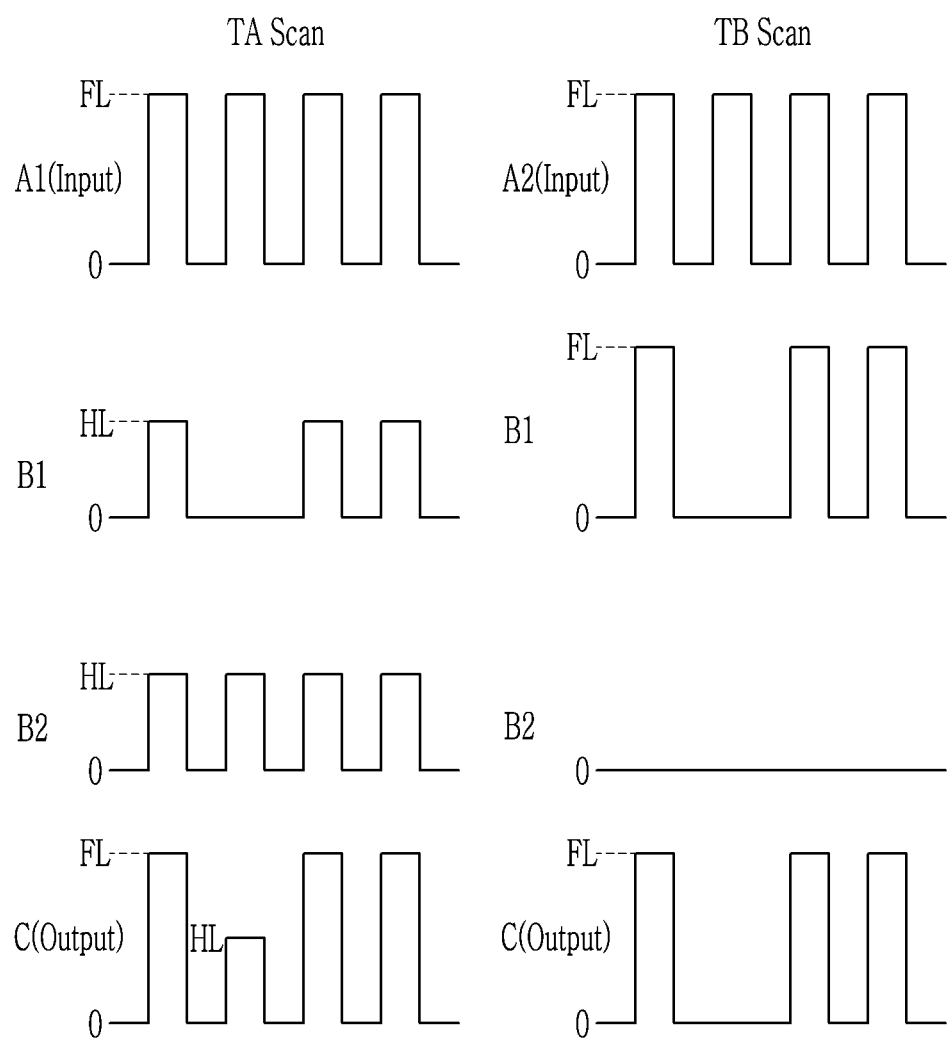
FIG. 9 is a waveform diagram of a signal input in an inspection step of a data line and a signal output when a left data line of adjacent data lines illustrated in FIG. 5 is opened in the display device according to an embodiment of the present inventive concept.
Figure 10:
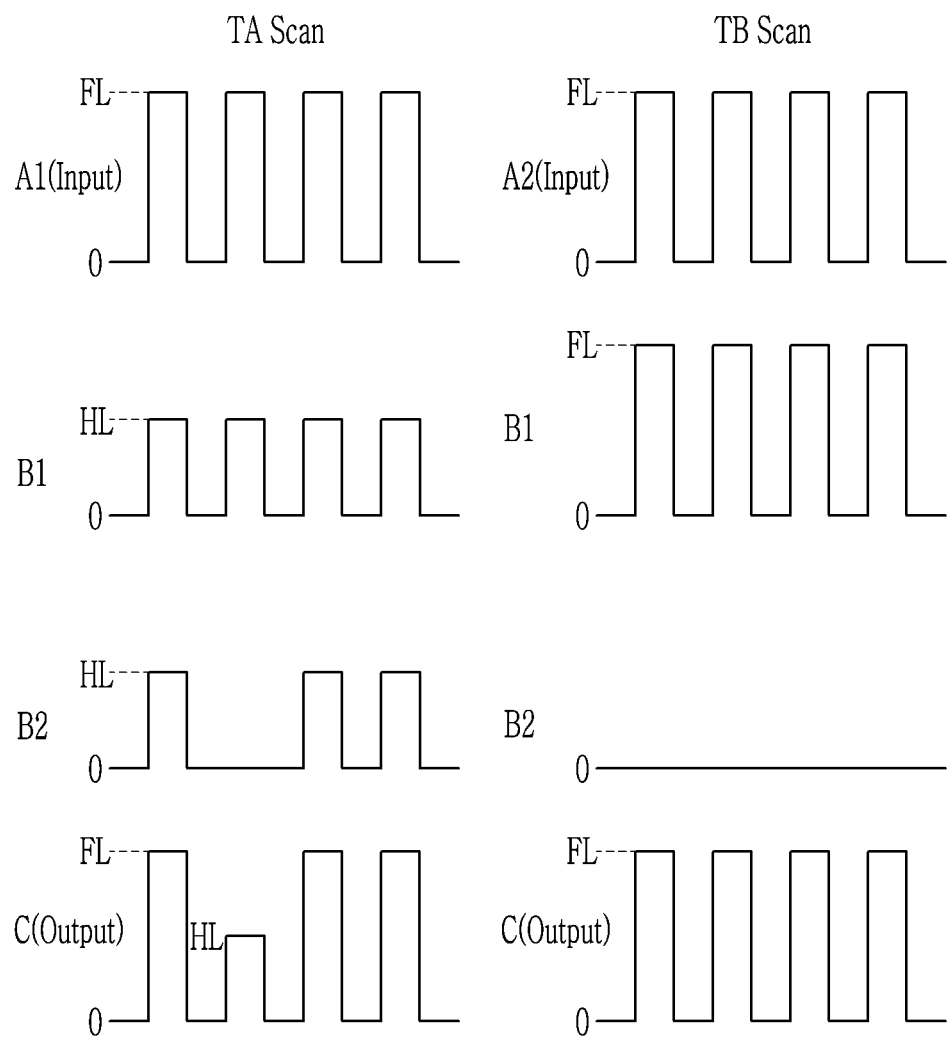
FIG. 10 is a waveform diagram of a signal input in an inspection step of a data line and a signal output when a right data line of adjacent data lines illustrated in FIG. 5 is opened in the display device according to an embodiment of the present inventive concept.

Next, referring to FIGS. 9 and 10 based on the normal waveform illustrated in FIG. 6, it will be described that a defect, for example, an open defect occurs in the left data line 171 of the two data lines 171 illustrated in FIG. 5 and the right data line 171 is normal (FIG. 9), and an open defect occurs in the right data line 171 of the two data lines 171 illustrated in FIG. 5 and the left data line 171 is normal (FIG. 10).

FIG. 9 is a waveform diagram of a signal input in an inspection step of a data line and a signal output when a left data line 171 of adjacent data lines 171 illustrated in FIG. 5 is opened in the display device according to an embodiment of the present inventive concept and FIG. 10 is a waveform diagram of a signal input in an inspection step of a data line and a signal output when a right data line of adjacent data lines illustrated in FIG. 5 is opened in the display device according to an embodiment of the present inventive concept.

First, referring to FIG. 9, in the first scan inspection TA Scan, when the input signal A1 is applied to the first and second inspection lines 173a and 173b of the data lines 171 of the first inspection area TA, the signal B1 of the data line 171 including the first inspection line 173a has a level of 0 at a timing when the opened defective data line 171 is scanned (a second pulse from the left of the signal B1 in FIG. 9) and the signal B2 of the data line 171 including the second inspection line 173b may have approximately the second level HL like the normal waveform of FIG. 6. The output signal C detected by the sensor pad 601 of the sensor device 600 may have approximately the second level HL which is lower than the first level FL and higher than 0 at the timing when the defective data line 171 is scanned as a result obtained by adding the potentials of the two signals B1 and B2.

Next, in the second scan inspection TB Scan, when the input signal A2 is applied to the first inspection line 173a of the data lines 171 of the second inspection area TB, the signal B2 of the data line 171 including the second inspection line 173b is 0, and the signal B1 of the data line 171 including the first inspection line 173a may have approximately a level of 0 at the timing when the opened defective data line 171 is scanned (a second pulse from the left of the signal B1 in FIG. 9). The output signal C detected by the sensor pad 601 of the sensor device 600 may have approximately a level of 0 at the timing when the defective data line 171 is scanned as a result obtained by adding potentials of the two signals B1 and B2.

Next, referring to FIG. 10, in the first scan inspection TA Scan, when the input signal A1 is applied to the first and second inspection line 173a and 173b of the data lines 171 of the first inspection area TA, the signal B1 of the data line 171 including the first inspection line 173a has approximately the second level HL like the normal waveform of FIG. 6 and the signal B2 of the data line 171 including the second inspection line 173b may have approximately a level of 0 at the timing when the opened defective data line 171 is scanned (a second pulse from the left of the signal B2 in FIG. 10). The output signal C detected by the sensor pad 601 of the sensor device 600 may have approximately the second level HL which is lower than the first level FL and higher than 0 at the timing when the defective data line 171 is scanned as a result obtained by adding the potentials of the two signals B1 and B2.

Next, in the second scan inspection TB Scan, when the input signal A2 is applied to the first inspection line 173a of the data lines 171 of the second inspection area TB, the signal B2 of the data line 171 including the second inspection line 173b is 0, and the signal B1 of the data line 171 including the first inspection line 173a may have approximately the first level FL like the normal waveform of FIG. 6. The output signal C detected by the sensor pad 601 of the sensor device 600 may have approximately the first level FL, like the normal waveform of FIG. 6, when the two signals B1 and B2 are added.

In the output signals C for the first and second scan inspections TA Scan and TB Scan, the waveform of the output signal C of FIG. 9, which is a case where defect in which the left data line 171 of the two adjacent data lines 171 illustrated in FIG. 5 is opened occurs, may be distinguished from the waveform of the output signal C of FIG. 10, which is a case where a defective in which the right data line 171 of the two adjacent data lines 171 illustrated in FIG. 5 is opened occurs. Further, whether the voltage level of the output signal C in the second scan inspection TB Scan is higher or lower than the voltage level of the output signal C in the first scan inspection TA Scan indicates which data line 171 is defective.

Further, when a difference in an abnormal level between the output signal C in the first scan inspection TA Scan and the output signal C in the second scan inspection TB Scan is approximately the second level HL, it may be determined that there is an open defect in the data line 171 corresponding to the corresponding pulse.

As described above, according to the embodiment of the present inventive concept, not only the position of the defective data line 171 may be detected, but also a cause of the defect may be inspected by analyzing the waveform of the output signal C. For example, when the data line 171 is shorted from another data line 171, as illustrated in FIGS. 7 to 10, an output signal having a waveform different from that of the output signal C due to a defect in which the data line 171 is shorted or opened from another conductive layer may be detected.

Next, a display device according to an embodiment of the present inventive concept will be described with reference to FIG. 11, along with the drawings described above.

FIG. 11 illustrates a portion of an inspection unit in the display device according to an embodiment of the present inventive concept.

Referring to FIG. 11, the display device according to the embodiment may be substantially the same as the embodiments illustrated in FIGS. 1, 2, and 5, but the inspection unit TPD may have a different shape. Here, the same description of the same components as in the above-described embodiment will be omitted, and the description will be mainly given of the differences.

Specifically, each data line 171 positioned in the inspection unit TPD may include one expansion 172a, 172b, or 172c and one inspection line 173a, 173b, or 173c connected to the expansion 172a, 172b, or 172c.

The expansions 172a, 172b, and 172c of the plurality of data lines 171 may be alternately positioned in three or more rows. FIG. 11 illustrates an example in which the expansions 172a, 172b, and 172c of the plurality of data lines 171 are alternately positioned in three rows. In this case, the expansions 172a, 172b, and 172c of three adjacent data lines 171 may be misaligned in the first direction DR1.

FIG. 11 illustrates an example in which each group UT includes three adjacent data lines 171. One data line 171 of the data lines 171 included in each group UT may include a first expansion 172a and a first inspection line 173a connected to the first expansion 172a, the other data line 171 may include a second expansion 172b and a second inspection line 173b connected to the second expansion 172b, and the remaining one data line may include a third expansion 172c and a third inspection line 173c connected to the third expansion 172c.

According to an embodiment, the inspection unit TPD may include the first inspection area TA, the second inspection area TB, and the third inspection area TC sequentially positioned below the area where the expansion parts 172a, 172b, and 172c are arranged.

The first inspection line 173a extends substantially in the second direction DR2 to extend to the lower end of the third inspection area TC through the first inspection area TA and the second inspection area TB. Accordingly, the first inspection line 173a may include an end portion positioned near the lower end of the third inspection area TC.

The second inspection line 173b may include a portion bent toward the first inspection line 173a under the second expansion 172b and then bent toward the second direction DR2 again. The second inspection line 173b bent toward the second direction DR2 extends substantially in the second direction DR2 and extends to the second inspection area TB. The second inspection line 173b may include an end portion which is not positioned in the third inspection area TC but positioned near a boundary line between the second inspection area TB and the third inspection area TC.

The third inspection line 173c may include a portion bent toward the second inspection line 173b under the third expansion 172c and then bent toward the second direction DR2 again. The third inspection line 173c bent toward the second direction DR2 extends substantially in the second direction DR2 and extends to the third inspection area TC. The third inspection line 173c may include an end portion which is not positioned in the second and third inspection areas TB but positioned near the boundary line between the first inspection area TA and the second inspection area TB.

Accordingly, all of three inspection lines 173a, 173b, and 173c included in each group UT may be positioned in the first inspection area TA, only two inspection lines 173a and 173b may be positioned in the second inspection area TB, while only one inspection line 173a may be positioned in the third inspection area TC.

The total length of the first inspection line 173a, the total length of the second inspection line 173b, and the total length of the third inspection line 173c may be the same as each other (e.g. when summing up the lengths of each portion of the inspection line rather than just measuring the length along one of direction DR1, DR2, and DR3).

The inspection lines 173a, 173b, and 173c may be alternately arranged in the first direction DR1. In this case, the (3k−2)-th (k is a natural number) data line 171 from the left may include the first inspection line 173a, the (3k−1)-th data line 171 may include the second inspection line 173b, and the 3k-th (k is the natural number) data line 171 may include the third inspection line 173c.

A distance D5 between the third inspection line 173c located at the right edge of the left group UT of the two adjacent groups UT and the first inspection line 173a located at the left edge of the right group UT thereof may be greater than the distance between two adjacent data lines 171 in the display area DA. That is, the distance D5 between the two inspection lines 173a and 173c respectively positioned in two adjacent groups UT in the first inspection area TA and facing each other may be greater than the distance between the two adjacent data lines 171 in the display area DA.

That is, a distance D6 between two first inspection lines 173a respectively positioned in two adjacent groups UT in the third inspection area TC and facing each other may be greater than the distance between the two adjacent data lines 171 in the display area DA.

Both the distance D5 between the two inspection lines 173a and 173c respectively positioned in two adjacent groups UT in the first inspection area TA and facing each other and the distance D6 between the two first inspection lines 173a positioned in two adjacent groups UT, respectively in the third inspection area TC and facing each other may be larger than the width Wt of the first direction DR1 of the inspection pin 501 of the inspection device 500. Therefore, when the data line 171 is inspected, the inspection device 500 may apply an input signal by distinguishing two adjacent groups UT from each other and inspect which group data line 171 is defective.

In addition, a distance D7 between two outer edges of two inspection lines 173a and 173c located at left and right edges among the inspection lines 173a, 173b, and 173c located in one group UT in the first inspection area TA may be smaller than the width Wt of the first direction DR1 of the inspection pin 501 of the inspection device 500. That is, the width Wt of the first direction DR1 of the inspection pin 501 of the inspection device 500 may be larger than the distance D7 between the left and right edges of all of the inspection lines 173a, 173b, and 173c positioned in the first inspection area TA of one group UT. Therefore, when inspecting the data line 171, the inspection device 500 may apply one input signal simultaneously without distinguishing the plurality of inspection lines 173a, 173b, and 173c located in one group UT, and thus, may apply the input signal to all of the inspection lines 173a, 173b, and 173c belonging to the group UT as if they were one inspection line.

The order of the inspection lines 173a, 173b, and 173c positioned in each group UT may be constant as illustrated in the drawings, or may be different therefrom.

Next, an inspection method for the data line of the display device according to an embodiment of the present inventive concept will be described with reference to FIGS. 12 to 15 together with FIG. 11.

First, a waveform of an output signal when the data lines 171 to be inspected are all normal will be described with reference to FIGS. 11 and 12.

Figure 12:
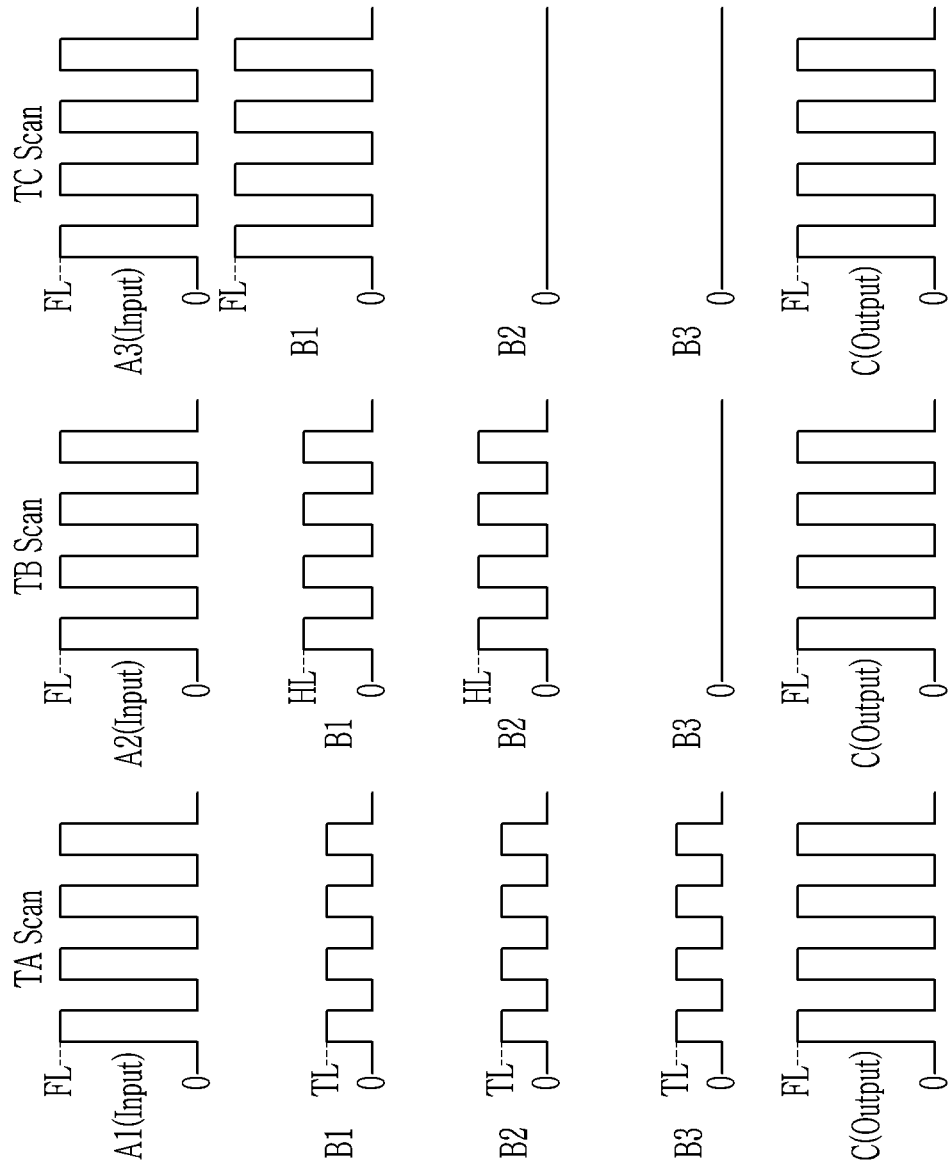
FIG. 12 is a waveform diagram of a signal input in an inspection step of a data line and a signal output when the data line is normal in a display device according to an embodiment of the present inventive concept.

FIG. 12 is a waveform diagram of a signal input in an inspection step of a data line and a signal output when the data line is normal in a display device according to an embodiment of the present inventive concept.

When the input signal A1 is applied to the inspection lines 173a, 173b, and 173c of the first inspection area TA in the first scan inspection TA Scan, the signals B1, B2, and B3 of the data line 171 may each have a third level TL lower than a first level FL. The third level TL may be, for example, approximately ⅓ of the first level FL. The output signal C of each group UT may have approximately the first level FL as a level acquired by adding potentials of the signals B1, B2, and B3.

Next, when the input signal A2 is applied to the inspection lines 173a and 173b of the second inspection area TB in the second scan inspection TB Scan, the input signal A2 is not applied to the third inspection line 173c, and as a result, the signal B3 of the data line 171 including the third inspection line 173c may be 0 and the signals B1 and B2 of the data line 171 including the first and second inspection lines 173a and 173b may be approximately equal to the second level HL. The output signal C may have approximately the first level FL as the level acquired by adding the potentials of the signals B1, B2, and B3.

Next, when the input signal A3 is applied to the inspection lines 173a of the third inspection area TC in the third scan inspection TC Scan, the input signal A3 is not applied to the second and third inspection line 173b and 173c, and as a result, the signals B2 and B3 of the data line 171 including the second and third inspection lines 173b and 173c may be 0 and the signal B1 of the data line 171 including the first inspection line 173a may be approximately equal to the second level FL. The output signal C may have approximately the first level FL as the level acquired by adding the potentials of the signals B1, B2, and B3.

Next, with reference to FIGS. 13 to 15 based on the normal waveform illustrated in FIG. 12, a case where an error occurs in which the left, center, and right data lines 171 of the data lines 171 of one group UT illustrated in FIG. 11 are shorted from different conductive layers, respectively, will be described.

Figure 13:
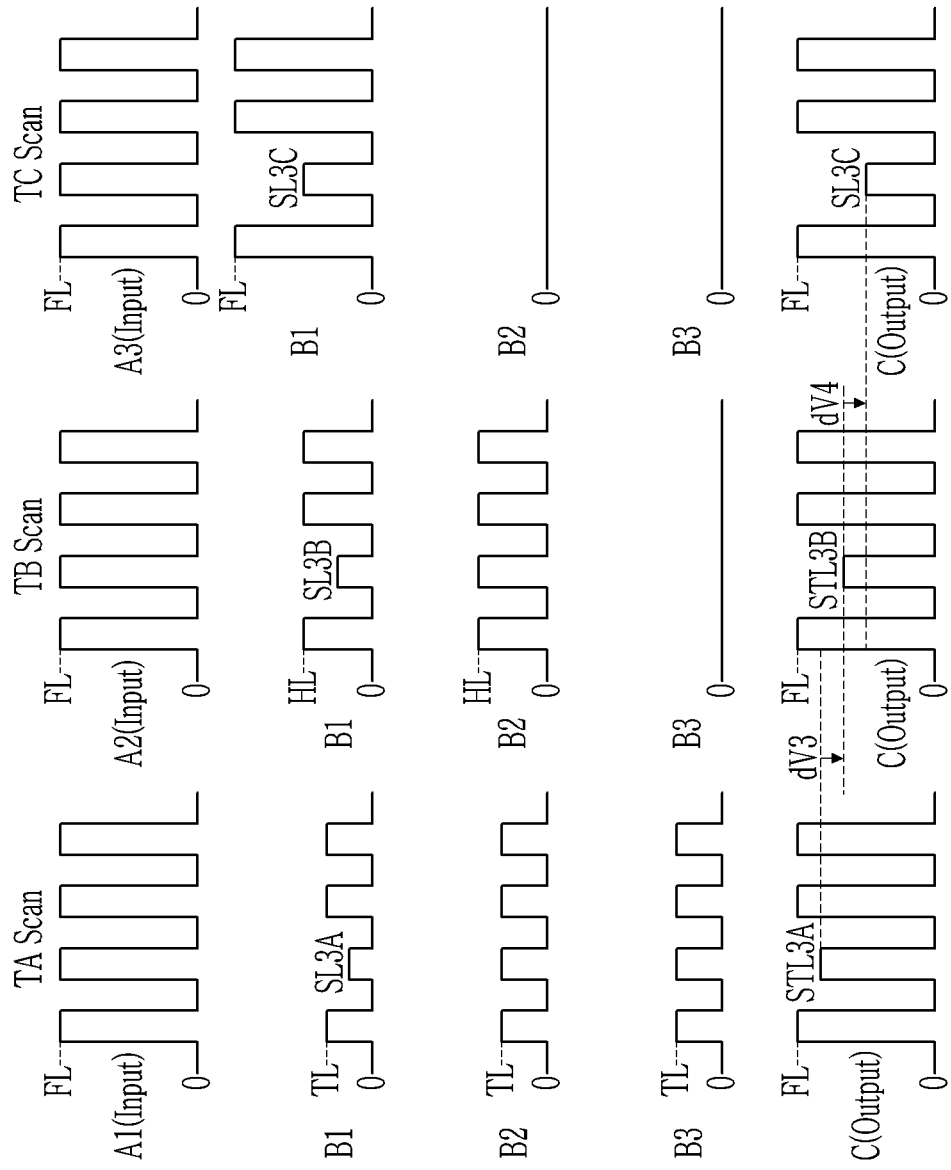
FIG. 13 is a waveform diagram of a signal input in an inspection step of a data line and a signal output when a left data line of adjacent data lines illustrated in FIG. 11 is shorted from a signal line of another conductive layer in the display device according to an embodiment of the present inventive concept.
Figure 14:
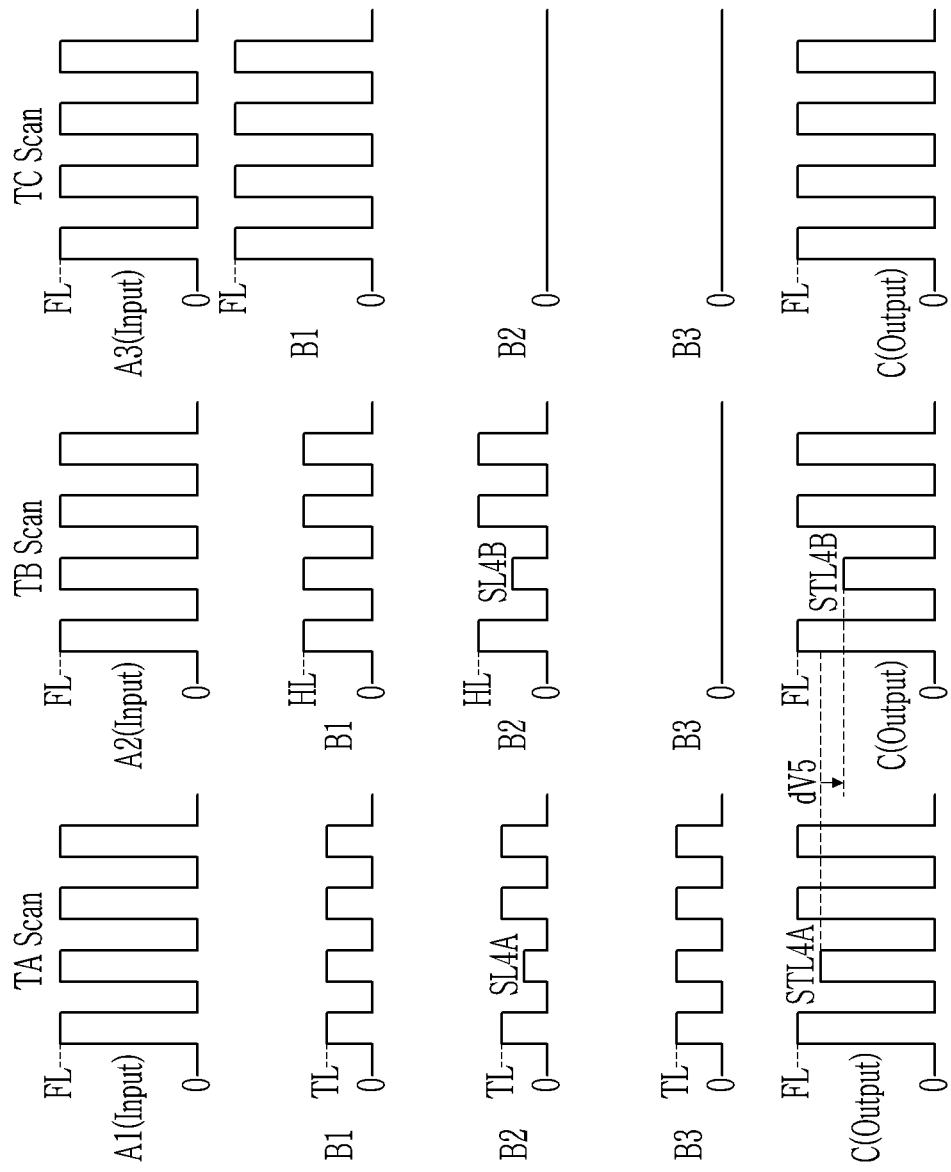
FIG. 14 is a waveform diagram of a signal input in an inspection step of a data line and a signal output when a middle data line of adjacent data lines illustrated in FIG. 11 is shorted from a signal line of another conductive layer in the display device according to an embodiment of the present inventive concept.

FIG. 13 is a waveform diagram of a signal input in an inspection step of a data line 171 and a signal output when a left data line 171 of adjacent data lines 171 illustrated in FIG. 11 is shorted from a signal line of another conductive layer in the display device according to an embodiment of the present inventive concept, FIG. 14 is a waveform diagram of a signal input in an inspection step of a data line 171 and a signal output when a middle data line 171 of adjacent data lines 171 illustrated in FIG. 11 is shorted from a signal line of another conductive layer in the display device according to an embodiment of the present inventive concept, and FIG. 15 is a waveform diagram of a signal input in an inspection step of a data line 171 and a signal output when a right data line 171 of adjacent data lines 171 illustrated in FIG. 11 is shorted from a signal line of another conductive layer in the display device according to an embodiment of the present inventive concept.

Referring to FIG. 13, when the input signal A1 is applied to the inspection lines 173a, 173b, and 173c of the first inspection area TA in the first scan inspection TA Scan, the signal B1 of the data line 171 including the first inspection line 173a has a level SL3A lower than the third level TL at a timing when a defective data line 171 is scanned and the signals B2 and B3 of the data line 171 including the second and third inspection lines 173b and 173c may be the same as the normal waveform of FIG. 12. The output signal C may have a level STL3A that is lower than the first level FL and higher than the second level HL at the timing at which the defective data line 171 is scanned.

Next, when the input signal A2 is applied to the first and second inspection lines 173a and 173b of the second inspection area TB in the second scan inspection TB Scan, the signal B3 of the data line 171 including the third inspection line 173c may be 0 and the signals B2 and B3 of the data line 171 including the first and second inspection lines 173a and 173b may have a level SL3B lower than the second level HL at the timing when the defective data line 171 is scanned. The output signal C may have a level STL3B that is lower than the first level FL and higher than the second level HL at the timing at which the defective data line 171 is scanned.

Next, when the input signal A3 is applied to the first inspection line 173a of the third inspection area TC in the third scan inspection TC Scan, the signals B2 and B3 of the data line 171 including the second and third inspection lines 173c may be 0 and the signal B1 of the data line 171 including the first inspection line 173a may have a level SL3C lower than the first level HL at the timing when the defective data line 171 is scanned. The output signal C may have a level SL3C that is lower than the first level FL and higher than 0 at the timing at which the defective data line 171 is scanned.

Here, the voltage level STL3B of the output signal C in the second scan inspection TB Scan is lower than the voltage level STL3A of the output signal C in the first scan inspection TA Scan by a potential difference dV3 and the voltage level SL3C of the output signal C in the third scan inspection TC Scan may be lower than the voltage level STL3B of the output signal C in the second scan inspection TB Scan by a potential difference dV4. The potential differences dV3 and dV4 are larger than 0.

Next, referring to FIG. 14, when the input signal A1 is applied to the inspection lines 173a, 173b, and 173c of the first inspection area TA in the first scan inspection TA Scan, the signal B2 of the data line 171 including the second inspection line 173b may have a level SL4A lower than the third level TL at the timing when the defective data line 171 is scanned and the signals B1 and B3 of the data line 171 including the first and third inspection lines 173a and 173c may be the same as the normal waveform of FIG. 12. The output signal C may have a level STL4A that is lower than the first level FL and higher than the second level HL at the timing at which the defective data line 171 is scanned.

Next, when the input signal A2 is applied to the first and second inspection lines 173a and 173b of the data lines 171 of the second inspection area TB in the second scan inspection TB Scan, the signal B3 of the data line 171 including the third inspection line 173c may be 0, the signal B2 of the data line 171 including the second inspection line 173b may have a level SL4B lower than the second level HL at the timing when the defective data line 171 is scanned, and the signal B1 of the data line 171 including the first inspection line 173a may be the same as the normal waveform of FIG. 12. The output signal C may have a level STL4B that is lower than the first level FL and higher than the second level HL at the timing at which the defective data line 171 is scanned.

Next, in the third scan inspection TC Scan, when the input signal A3 is applied to the first inspection line 173a of the data lines 171 of the third inspection area TC, the signals B2 and B3 of the data line 171 including the second and third inspection lines 173b and 173c may be 0 and the signal B1 of the data line 171 including the first inspection line 173a may be the same as the normal waveform of FIG. 12. The output signal C may also be the same as the normal waveform of FIG. 12.

Here, the voltage level STL4B of the output signal C in the second scan inspection TB Scan is lower than the voltage level STL4A of the output signal C in the first scan inspection TA Scan by a potential difference dV5 and the voltage level STL4A of the output signal C in the first scan inspection TA Scan may be lower than the first level FL as the voltage level of the output signal C in the third scan inspection TC Scan. The potential difference dV5 is larger than 0.

Next, referring to FIG. 15, when the input signal A1 is applied to the inspection lines 173a, 173b, and 173c of the first inspection area TA in the first scan inspection TA Scan, the signal B3 of the data line 171 including the third inspection line 173c may have a level SL5A lower than the third level TL at the timing when the defective data line 171 is scanned and the signals B1 and B2 of the data line 171 including the first and second inspection lines 173a and 173b may be the same as the normal waveform of FIG. 12. The output signal C may have a level STL5A that is lower than the first level FL and higher than the second level HL at the timing at which the defective data line 171 is scanned.

Next, in the second scan inspection TB Scan, when the input signal A2 is applied to the first and second inspection lines 173a and 173b of the second inspection area TB, the signal B3 of the data line 171 including the third inspection line 173c may be 0 and the signals B1 and B2 of the data line 171 including the first and second inspection lines 173a and 173b may be the same as the normal waveform of FIG. 12. The output signal C may be the same as the normal waveform of FIG. 12.

Next, in the third scan inspection TC Scan, when the input signal A3 is applied to the first inspection line 173a of the third inspection area TC, the signals B2 and B3 of the data line 171 including the second and third inspection lines 173b and 173c may be 0 and the signal B1 of the data line 171 including the first inspection line 173a may be the same as the normal waveform of FIG. 12. The output signal C may also be the same as the normal waveform of FIG. 12.

As such, the inspection may reveal which data line 171 is defective through the information on the waveform and/or the potential differences dV3, dV4, and dV5 of the output signal C that obtained through three scan inspections TA Scan, TB Scan, and TC Scan for three inspection areas TA, TB, and TC.

According to the embodiment, it is possible to check which group UT has a defective data line 171 through the first scan inspection TA Scan and to check which data line 171 of each group UT is defective through the second scan inspection TB Scan and the third scan inspection TC Scan.

Even for the defect in which the data line 171 of the display device according to the embodiment illustrated in FIG. 11 is shorted or cut from another data line 171, it may be inspected which data line 171 is defective and a defective cause may also be inspected with the information on the waveform and/or the potential difference of the output signal C.

Next, the embodiment illustrated in FIG. 11 will be further expanded and described with reference to FIG. 16.

FIG. 16 illustrates a portion of an inspection unit in the display device according to an embodiment of the present inventive concept.

Referring to FIG. 16, each of a plurality of groups UT repeatedly arranged in the first direction DR1 may include n (n is a natural number of 2 or more) data lines 171. The data line inspection area may include n inspection areas T1, T2, . . . , and Tn including the first inspection area TA and the second inspection area TB described above. n inspection lines 173(1), . . . , 173(n−1), and 173n included in n data lines 171 positioned in each group UT may extend to the lower ends of n inspection areas T1, T2, . . . , and Tn in sequence, respectively. That is, the first inspection line 173(1) may extend to the lower end of the n-th inspection area Tn, the (n−1)-th inspection line 173(n−1) may extend to the lower end of the second inspection area T2, and the n-th inspection line 173(n) may extend to the lower end of the first inspection area T1. Therefore, n inspection lines 173(1), . . . , 173(n−1), 173n may be located in the first inspection area T1, (n−1) inspection lines 173(1), . . . , 173(n−1) may be located in the second inspection area T2, and one inspection line 173(1) may be located in the n-th inspection area Tn.

A distance D8 between two inspection lines 173n and 173(1), which are respectively located in two adjacent groups UT in the first inspection area T1 and facing each other, is larger than the width Wt of the first direction DR1 of the inspection pin 501 of the inspection device 500.

Therefore, when the data line 171 is inspected, the inspection device 500 may apply an input signal by distinguishing two adjacent groups UT from each other and inspect which group of data line 171 is defective.

In addition, the width Wt of the first direction DR1 of the inspection pin 501 of the inspection device 500 is larger than the distance D9 between two outer edges of two inspection lines 173(1) and 173(n) positioned at the left and right edges of the inspection lines 173(1), . . . , 173(n−1), and 173n positioned in one group UT in the first inspection area T1. Therefore, when inspecting the data line 171, the inspection device 500 may apply one input signal simultaneously without distinguishing the plurality of inspection lines 173 (1), . . . , 173(n−1), and 173n located in one group UT, and thus, may apply the input signal to all of the inspection lines 173(1), . . . , 173(n−1), and 173n belonging to the group UT as if they were one inspection line.

At the time of inspecting whether the data line 171 is defective, the inspection device 500 described above may scan and apply the input signals in sequence for n inspection areas T1, T2, . . . , and Tn and detect the defective data line 171 through the output signal obtained through the sensor device 600.

According to the embodiment, it is possible to check which group UT has the defective data line 171 through scan inspection for the first inspection area T1 and to specifically check which data line 171 is defective through scan inspection for the remaining inspection areas T2, . . . , Tn.

The order of the inspection lines 173(1), . . . , 173(n−1), and 173n located in each group UT may be different from that illustrated in the drawing.

Next, the display device according to an embodiment of the present inventive concept will be described with reference to FIG. 17.

FIG. 17 is a plan view of a display device according to an embodiment of the present inventive concept.

Referring to FIG. 17, a display device 1000a according to an embodiment of the present inventive concept is mostly the same as the display device 1000 illustrated in FIGS. 1 and 2, but the display device 1000a may include a first inspection unit TPDa and a second inspection unit TPDb which are respectively positioned below and above the display area DA and facing each other. The first inspection unit TPDa may be located outside the first edge BL1 of the display area DA and the second inspection unit TPDb may be located outside the second edge BL2 of the display area DA.

Some of the plurality of data lines 171 may include expansions 172a1 and 172b1 which extend to the non-display area NDA located outside the first edge BL1 of the display area DA and are located in the first inspection unit TPDa, and inspection lines 173a1 and 173b1 connected to the expansions 172a1 and 172b1. The remaining data lines of the plurality of data lines 171 may include expansions 172a2 and 172b2 which extend to the non-display area NDA located outside the second edge BL2 of the display area DA and are located in the second inspection unit TPDb, and inspection lines 173a2 and 173b2 connected to the expansions 172a2 and 172b2

The data line 171 including the inspection lines 173a1 and 173b1 located in the first inspection unit TPDa may be, for example, an odd numbered data line 171 from the left and the data line 171 including the inspection lines 173a2 and 173b2 located in the second inspection unit TPDb may be, for example, an even numbered data line 171 from the left, or vice versa.

The plurality of data lines 171 located in the first inspection unit TPDa may be divided into a plurality of groups UTa which are repeatedly disposed in the first direction DR1 and the plurality of data lines 171 located in the second inspection unit TPDb may be divided into a plurality of groups UTb which are repeatedly disposed in the first direction DR1. Each group UTa or UTb may include two or more data lines 171, and the inspection lines 173a1, 173b1, 173a2, and 173b2 of the data lines 171 of each group UTa or UTb may have the same form as various embodiments described above. Since various features of the embodiment described above may be similarly applied, the same description is omitted.

In order to inspect whether the data line 171 of the display device 1000a is defective, the data line inspecting method described above is performed for each of the first inspection unit TPDa and the second inspection unit TPDb to detect the defective data line 171.

Next, the display device according to an embodiment of the present inventive concept will be described with reference to FIG. 18 along with the drawings described above.

FIG. 18 illustrates an inspection unit in the display device according to an embodiment of the present inventive concept.

Referring to FIG. 18, the display device according to the embodiment is mostly similar to the display device in the embodiment described above, but both the display devices may be different in terms of the shape of the second inspection line 173b of the inspection unit TPD. Specifically, a second part 72b of the second inspection line 173b may extend in a direction oblique to the first direction DR1 and the second direction DR2.

Next, the display device according to an embodiment of the present inventive concept will be described with reference to FIG. 19.

FIG. 19 illustrates portions of an inspection unit and a pad unit of a display device according to an embodiment of the present inventive concept.

The plurality of data lines 171 included in the display device according to an embodiment of the present inventive concept may further include a wiring unit 174 connected to the expansions 172a and 172b and the inspection lines 173a and 173b described in the embodiment described above. The wiring unit 174 may include an end portion 179 which extends substantially in the second direction DR2 from the inspection unit TPD and is located in a pad unit PAD through a fan-out unit FO in which a distance between adjacent wiring units 174 gradually decreases. That is, the inspection unit TPD according to an embodiment of the present inventive concept may be located between the edges of the pad unit PAD and the display area DA. A flexible printed circuit film or a driving circuit chip capable of applying a data signal to the data line 171 may be connected to the end portion 179.

In the inspection unit TPD, the wiring unit 174 may be located on a different conductive layer from the expansions 172a and 172b and the inspection lines 173a and 173b. The wiring unit 174 may be electrically connected to the expansions 172a and 172b around the edge of the display area DA. In the inspection unit TPD, at least some of the expansions 172a and 172b and the inspection lines 173a and 173b may overlap with the wiring unit 174 in plan view.

The embodiment illustrated in FIG. 19 relates to a case where the expansions 172a and 172b and the inspection lines 173a and 173b of the data line 171 are located between the pad unit PAD and the display area DA. However, the positions of the expansions 172a, 172b, and 172c and the inspection lines 173a, 173b, and 173c according to various embodiments described above are not limited thereto, but the expansions 172a, 172b, and 172c and the inspection lines 173a, 173b, and 173c may be located in the non-display area NDA where the pad unit PAD is not located.

While the present inventive concept has been described in connection with what is presently considered to be practical embodiments, it is to be understood that the present inventive concept is not limited to the disclosed embodiments, but, on the contrary, is intended to cover various modifications and equivalent arrangements included within the spirit and scope of the appended claims.

DESCRIPTION OF SYMBOLS

110: Substrate
121: Gate line
171: Data line
172a, 172b, 172c, 172a1, 172b1, 172a2, 172b2: Expansion
173a, 173b, 173c, 173a1, 173b1, 173a2, 173b2: Inspection line
400a, 400b: Gate driver
500: Inspection device
501: Inspection pin
600: Sensor device
601: Sensor pad
1000, 1000a: Display device
TA, TB, TC: Inspection area
TPD, TPDa, TPDb: Inspection unit
UT, UTa, UTb: Group While the present inventive concept has been described in connection with what is presently considered to be practical embodiments, it is to be understood that the present inventive concept is not limited to the disclosed embodiments. On the contrary, it is intended to cover various modifications and equivalent arrangements included within the spirit and scope of the appended claims.

What is claimed is:

1. A display device comprising:
a display area including a plurality of pixels and a plurality of data lines; and
a non-display area located around the display area and including an inspection unit,
wherein a first data line among the plurality of data lines includes a first inspection line located in the inspection unit,
a second data line adjacent to the first data line in a first direction among the plurality of data lines includes a second inspection line located in the inspection unit,
the first inspection line extends in a second direction different from the first direction,
the second inspection line includes a first portion extending in the second direction, a second portion bent toward the first inspection line from the first portion and extending toward the first inspection line, and a third portion bent from the second portion and extending in parallel with the first inspection line, and
an end portion of the first inspection line and an end portion of the second inspection line are spaced apart from each other in the second direction.

2. The display device of claim 1, wherein:
the inspection unit includes a first inspection area and a second inspection area adjacent to each other in the second direction,
both the first inspection line and the second inspection line are located in the first inspection area, and
the first inspection line is located in and the second inspection line is not located in the second inspection area.

3. The display device of claim 2, wherein:
the first data line includes a first expansion located between the first inspection area and the display area and connected to the first inspection line, and
the second data line includes a second expansion located between the first inspection area and the display area and connected to the second inspection line.

4. The display device of claim 3, wherein:
the first expansion and the second expansion are misaligned in the first direction.

5. The display device of claim 2, wherein:
a distance between two outer edges of the first and second inspection lines is smaller than a distance between two adjacent data lines in the display area among the plurality of data lines.

6. A display device comprising:
a display area including a plurality of pixels and a plurality of data lines; and
a non-display area located around the display area and including an inspection unit,
wherein the plurality of data lines is divided into a plurality of groups which are repeatedly disposed in a first direction,
each of the plurality of groups includes a first data line and a second data line,
the first data line includes a first inspection line located in the inspection unit,
the second data line includes a second inspection line located in the inspection unit,
the first inspection line extends in a second direction different from the first direction,
the second inspection line includes a portion bent toward the first inspection line, and
an end portion of the first inspection line and an end portion of the second inspection line are spaced apart from each other in the second direction.

7. The display device of claim 6, wherein:
the inspection unit includes a first inspection area and a second inspection area adjacent to each other in the second direction,
both the first inspection line and the second inspection line are located in the first inspection area, and
the first inspection line is located in and the second inspection line is not located in the second inspection area.

8. The display device of claim 7, wherein:
the first data line includes a first expansion located between the first inspection area and the display area and connected to the first inspection line, and
the second data line includes a second expansion located between the first inspection area and the display area and connected to the second inspection line.

9. The display device of claim 8, wherein:
the first expansion and the second expansion are misaligned in the first direction.

10. The display device of claim 7, wherein:
a distance between two outer edges of the first and second inspection lines included in one group among the plurality of groups is smaller than a distance between two adjacent data lines in the display area among the plurality of data lines.

11. The display device of claim 10, wherein:
the plurality of groups includes a first group and a second group adjacent to each other, and a distance between the second inspection line included in the first group and the first inspection line included in the second group is greater than a distance between two adjacent data lines in the display area among the plurality of data lines.

12. The display device of claim 11, wherein:
a distance between the second inspection line included in the first group and the first inspection line included in the second group is greater than 50 micrometers.

13. The display device of claim 6, wherein:
the second inspection line includes a first portion extending in the second direction, a second portion bent toward the first inspection line from the first portion and extending toward the first inspection line, and a third portion bent from the second portion and extending in parallel with the first inspection line.

14. The display device of claim 6, wherein:
each of the plurality of groups further includes a third data line adjacent to the second data line,
the third data line includes a third inspection line located in the inspection unit,
the third inspection line includes a portion bent toward the second inspection line, and
an end portion of the third inspection line and an end portion of the second inspection line are spaced apart from each other in the second direction.

15. The display device of claim 14, wherein:
the inspection unit includes a first inspection area, a second inspection area, and a third inspection area adjacent to each other in the second direction,
the first inspection line, the second inspection line, and the third inspection line are all located in the first inspection area,
the first inspection line and the second inspection line are located in and the third inspection line is not located in the second inspection area, and
the first inspection line is located in and the second inspection line and the third inspection line are not located in the third inspection area.

16. An inspection method of a display device including a display area including a plurality of pixels and a plurality of data lines, and a non-display area located around the display area and including an inspection unit, in which the inspection unit includes a first inspection area and a second inspection area adjacent to each other, the plurality of data lines is divided into a plurality of groups which are repeatedly disposed in a first direction each of the plurality of groups includes a first data line and a second data line, the first data line includes a first inspection line located in the first and second inspection areas, and the second data line includes a second inspection line located in in the first inspection area and not located in the second inspection area, the inspection method comprising:
applying a first input signal to the first inspection line and the second inspection line by scanning in the first direction in the first inspection area;
applying a second input signal to the first inspection line by scanning in the first direction in the second inspection area; and
measuring potentials of the plurality of data lines to obtain an output signal that indicates whether a data line is defective.

17. The inspection method of claim 16, wherein:
a distance between two outer edges of the first inspection line and the second inspection line included in one group among the plurality of groups is smaller than a width in the first direction of an inspection pin of an inspection device, the inspection device being used in the applying of the first input signal and the applying of the second input signal.

18. The inspection method of claim 17, wherein:
the plurality of groups includes a first group and a second group adjacent to each other, and
a distance between the second inspection line included in the first group and the first inspection line included in the second group is greater than a width of the inspection pin in the first direction.

19. The inspection method of claim 16, wherein:
the output signal includes,
a first output signal detected in response to applying the first input signal to the first inspection area, and
a second output signal detected in response to applying the second input signal to the second inspection area.

20. The inspection method of claim 19, wherein:
waveforms of the first and second output signals detected when the first data line is defective are different from waveforms of the first and second output signals detected when the second data line is defective.

* * * * *